(12) United States Patent
Hosono

(10) Patent No.: US 7,733,702 B2
(45) Date of Patent: Jun. 8, 2010

(54) SEMICONDUCTOR MEMORY DEVICE AND METHOD OF ERASING DATA THEREIN

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/954,813

(22) Filed: Dec. 12, 2007

(65) Prior Publication Data

US 2008/0137422 A1    Jun. 12, 2008

(30) Foreign Application Priority Data

Dec. 12, 2006    (JP) ............... 2006-334283

(51) Int. Cl.
*G11C 16/06* (2006.01)
(52) U.S. Cl. ............... 365/185.2; 365/185.17; 365/185.24; 365/185.29; 365/185.15
(58) Field of Classification Search ............ 365/185.17, 365/185.2, 185.24, 195.29, 185.15
See application file for complete search history.

(56) References Cited

U.S. PATENT DOCUMENTS 6,134,140 A    10/2000    Tanaka et al.
7,518,920 B2 *    4/2009    Kang ............... 365/185.17
2006/0039230 A1 *    2/2006    Kurata et al. ............ 365/232
2006/0139997 A1    6/2006    Park et al.

FOREIGN PATENT DOCUMENTS

JP    2006-186359    7/2006

* cited by examiner

*Primary Examiner*—Thong Q Le
(74) *Attorney, Agent, or Firm*—Oblon, Spivak, McClelland, Maier & Neustadt, L.L.P.

(57) ABSTRACT

A semiconductor memory device includes a memory cell array of NAND cell units. The NAND cell unit includes a plurality of electrically erasable programmable nonvolatile memory cells connected serially, and a first and a second selection transistor provided to connect both ends of the memory cells to a bit line and a source line, respectively. The semiconductor memory device also includes dummy cells inserted in the NAND cell unit adjacent to the first and second selection transistors, respectively. The dummy cells in the NAND cell unit are erased simultaneously with the memory cells under a weaker erase potential condition than that for the memory cells and set in a higher threshold distribution than an erased state of the memory cells.

16 Claims, 23 Drawing Sheets

FIG. 8

With Dummy WL (Va > Vb)

|  | WL0 Selected | WL1 Selected | WL2 Selected | WL3 Selected | WL4 Selected | WL5 Selected | WL6 Selected | WL7 Selected |
|---|---|---|---|---|---|---|---|---|
| SGD | 2.5V | 2.5V | 2.5V | 2.5V | 2.5V | 2.5V | 2.5V | 2.5V |
| WLDD | VPDD | VPDD | VPDD | VPDD | VPDD | VPDD | VPDD | VPDD |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | Vb |
| WL4 | Vm | Vm | Vm | Vm | Vpgm | Va | Vb | Vm |
| WL3 | Vm | Vm | Vm | Vpgm | Va | Vb | Vm | Vm |
| WL2 | Vm | Vm | Vpgm | Va | Vb | Vm | Vm | Vm |
| WL1 | Vm | Vpgm | Va | Vb | Vm | Vm | Vm | Vm |
| WL0 | Vpgm | Va | Vb | Vm | Vm | Vm | Vm | Vm |
| WLDS | VPDS | VPDS | VPDS | VPDS | VPDS | VPDS | VPDS | VPDS |
| SGS | 0V | 0V | 0V | 0V | 0V | 0V | 0V | 0V |

FIG. 9

With Dummy WL (Va > Vb > Vc)

|  | WL0 Selected | WL1 Selected | WL2 Selected | WL3 Selected | WL4 Selected | WL5 Selected | WL6 Selected | WL7 Selected |
|---|---|---|---|---|---|---|---|---|
| SGD | 2.5V | 2.5V | 2.5V | 2.5V | 2.5V | 2.5V | 2.5V | 2.5V |
| WLDD | VPDD | VPDD | VPDD | VPDD | VPDD | VPDD | VPDD | VPDD |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | Vb |
| WL4 | Vm | Vm | Vm | Vm | Vpgm | Va | Vb | Vc |
| WL3 | Vm | Vm | Vm | Vpgm | Va | Vb | Vc | Vm |
| WL2 | Vm | Vm | Vpgm | Va | Vb | Vc | Vm | Vm |
| WL1 | Vm | Vpgm | Va | Vb | Vc | Vm | Vm | Vm |
| WL0 | Vpgm | Va | Vb | Vc | Vm | Vm | Vm | Vm |
| WLDS | VPDS | VPDS | VPDS | VPDS | VPDS | VPDS | VPDS | VPDS |
| SGS | 0V | 0V | 0V | 0V | 0V | 0V | 0V | 0V |

FIG. 10

Without Dummy WL (Va > Vb)

|     | WL0 Selected | WL1 Selected | WL2 Selected | WL3 Selected | WL4 Selected | WL5 Selected | WL6 Selected | WL7 Selected |
|-----|------|------|------|------|------|------|------|------|
| SGD | 2.5V | 2.5V | 2.5V | 2.5V | 2.5V | 2.5V | 2.5V | 2.5V |
| WL7 | Vm   | Vm   | Vm   | Vm   | Vm   | Vm   | Vm   | Vpgm |
| WL6 | Vm   | Vm   | Vm   | Vm   | Vm   | Vm   | Vpgm | Va   |
| WL5 | Vm   | Vm   | Vm   | Vm   | Vm   | Vpgm | Va   | Vb   |
| WL4 | Vm   | Vm   | Vm   | Vm   | Vpgm | Va   | Vb   | Vm   |
| WL3 | Vm   | Vm   | Vm   | Vpgm | Va   | Vb   | Vm   | Vm   |
| WL2 | Vm   | Vm   | Vpgm | Va   | Vb   | Vm   | Vm   | Vm   |
| WL1 | Vm   | Vpgm | Va   | Vb   | Vm   | Vm   | Vm   | Vm   |
| WL0 | Vpgm | Va   | Vb   | Vm   | Vm   | Vm   | Vm   | Vm   |
| SGS | 0V   | 0V   | 0V   | 0V   | 0V   | 0V   | 0V   | 0V   |

|  | Erase Voltage Applying Method 1 | Erase Voltage Applying Method 2 | Erase Voltage Applying Method 3 |
|---|---|---|---|
| SGD | ~Vera | ~Vera | VESG |
| WLDD | VEDD | VEDD | VEDD |
| WL7 | 0V | VE | VE |
| WL6 | 0V | VE | VE |
| WL5 | 0V | VE | VE |
| WL4 | 0V | VE | VE |
| WL3 | 0V | VE | VE |
| WL2 | 0V | VE | VE |
| WL1 | 0V | VE | VE |
| WL0 | 0V | VE | VE |
| WLDS | VEDS | VEDS | VEDS |
| SGS | ~Vera | ~Vera | VESG |

FIG. 16A
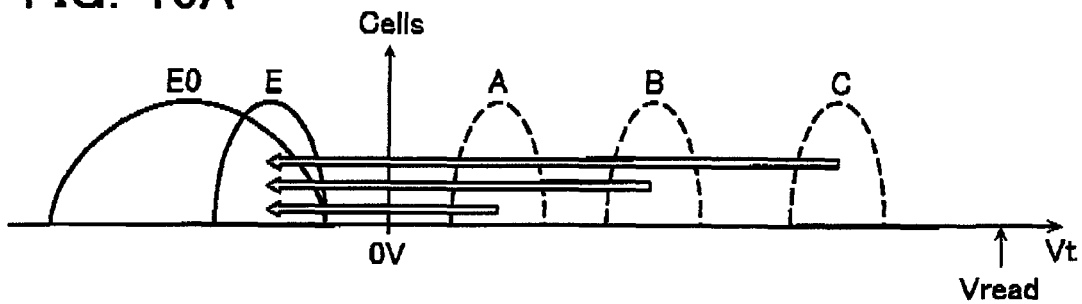
FIG. 16B
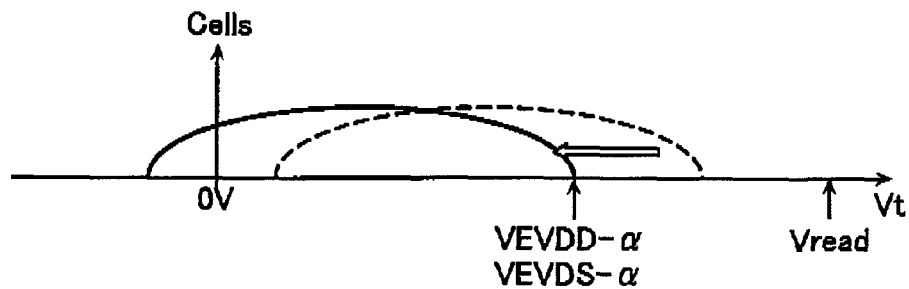
FIG. 17
|  | Erase Verify Voltage Applying Method |
|---|---|
| SGD | About 4V |
| WLDD | VEVDD |
| WL7 | VEV |
| WL6 | VEV |
| WL5 | VEV |
| WL4 | VEV |
| WL3 | VEV |
| WL2 | VEV |
| WL1 | VEV |
| WL0 | VEV |
| WLDS | VEVDS |
| SGS | About 4V |

FIG. 19

|  | Voltage Applying Method (1) on Soft Programming | Voltage Applying Method (2) on Soft Programming |
|---|---|---|
| SGD | 2.5V | 2.5V |
| WLDD | VSPDD | VspgmDD |
| WL7 | Vspgm | Vspgm |
| WL6 | Vspgm | Vspgm |
| WL5 | Vspgm | Vspgm |
| WL4 | Vspgm | Vspgm |
| WL3 | Vspgm | Vspgm |
| WL2 | Vspgm | Vspgm |
| WL1 | Vspgm | Vspgm |
| WL0 | Vspgm | Vspgm |
| WLDS | VSPDS | VspgmDS |
| SGS | 0V | 0V |

| | Voltage Applying Method at Soft Program Verifying Step S6 | Voltage Applying Method at Soft Program Verifying Step S8 |
|---|---|---|
| SGD | About 4V | About 4V |
| WLDD | VRDD | VRDD |
| WL7 | VEV | VSP |
| WL6 | VEV | VSP |
| WL5 | VEV | VSP |
| WL4 | VEV | VSP |
| WL3 | VEV | VSP |
| WL2 | VEV | VSP |
| WL1 | VEV | VSP |
| WL0 | VEV | VSP |
| WLDS | VRDS | VRDS |
| SGS | About 4V | About 4V |

FIG. 22

| | Write | Write | Pre Prog | Erase | Erase Verify | Soft Prog(1) | Soft Prog Verify 1 | Soft Prog Verify 2 | Read or Prog Vfy |
|---|---|---|---|---|---|---|---|---|---|
| BL | 0V/Vdd | 0V/Vdd | 0V | ~Vera | Vsense | 0V/Vdd | Vsense | Vsense | Vsense |
| SGD | 2.5V | 2.5V | ~4.5V | ~Vera | ~4.5V | 2.5V | ~4.5V | ~4.5V | ~4.5V |
| WLDD | VP DD | VP DD | Vpgm | VE DD | VEV DD | VSP DD | VR DD | VR DD | VR DD |
| WL7 | Vm | Vpgm | Vm | VE | VEV | Vspgm | VEV | VSP | Vread |
| WL6 | Vm | Va | Vm | VE | VEV | Vspgm | VEV | VSP | Vread |
| WL5 | Vm | Vb | Vm | VE | VEV | Vspgm | VEV | VSP | Vread |
| WL4 | Vm | Vc | Vm | VE | VEV | Vspgm | VEV | VSP | Vread |
| WL3 | Vm | Vm | Vm | VE | VEV | Vspgm | VEV | VSP | Vread |
| WL2 | Vm | Vm | Vm | VE | VEV | Vspgm | VEV | VSP | Vread |
| WL1 | Vm | Vm | Vm | VE | VEV | Vspgm | VEV | VSP | Vread |
| WL0 | Vpgm | Vm | Vpgm | VE DS | VEV DS | VSP DS | VEV | VSP | VCGRV |
| WLDS | VP DS | VP DS | ~4.5V | ~Vera | ~4.5V | 0V | ~4.5V | VR DS | VR DS |
| SGS | 0V | 0V | 0V | ~Vera | ~4.5V | 0V | ~4.5V | ~4.5V | ~4.5V |
| CELSRC | ~Vdd | ~Vdd | 0V | ~Vera | Vdd | ~Vdd | Vdd | Vdd | 0V |

FIG. 26

| | Write | Write | Erase | Erase Verify | Dummy Cell Prog | Dummy Cell Verify | Soft Prog(1) | Soft Prog Verify 1 | Soft Prog Verify 2 | Read or Prog Vfy |
|---|---|---|---|---|---|---|---|---|---|---|
| BL | 0V/Vdd | 0V/Vdd | ~Vera | Vsense | 0V/Vdd | Vsense | 0V/Vdd | Vsense | Vsense | Vsense |
| SGD | 2.5V | 2.5V | ~Vera | ~4.5V | ~4.5V | ~4.5V | 2.5V | ~4.5V | ~4.5V | ~4.5V |
| WLDD | VP DD | VP DD | VE DD | VE DD | Vpgm | VAV (Vread) | VSP DD | VR DD | VR DD | VR DD |
| WL7 | Vm | Vpgm | VE | VEV | Vm | Vread | Vspgm | VEV | VSP | Vread |
| WL6 | Vm | Va | VE | VEV | Vm | Vread | Vspgm | VEV | VSP | Vread |
| WL5 | Vm | Vb | VE | VEV | Vm | Vread | Vspgm | VEV | VSP | Vread |
| WL4 | Vm | Vc | VE | VEV | Vm | Vread | Vspgm | VEV | VSP | Vread |
| WL3 | Vm | Vm | VE | VEV | Vm | Vread | Vspgm | VEV | VSP | Vread |
| WL2 | Vm | Vm | VE | VEV | Vm | Vread | Vspgm | VEV | VSP | Vread |
| WL1 | Vm | Vm | VE | VEV | Vm | Vread | Vspgm | VEV | VSP | Vread |
| WL0 | Vpgm | Vm | VE | VEV | Vpgm | VAV | Vspgm | VEV | VSP | VCGRV |
| WLDS | VP DS | VP DS | VE DS | VEV DS | 0V | ~4.5V | VSP DS | ~4.5V | VR DS | VR DS |
| SGS | 0V | 0V | ~Vera | ~4.5V | 0V | ~4.5V | 0V | ~4.5V | ~4.5V | ~4.5V |
| CELSRC | ~Vdd | ~Vdd | ~Vera | Vdd | 0V | 0V | ~Vdd | Vdd | Vdd | 0V |

SEMICONDUCTOR MEMORY DEVICE AND METHOD OF ERASING DATA THEREIN

CROSS-REFERENCE TO RELATED APPLICATION

This application is based upon and claims the benefit of priority from prior Japanese Patent Application No. 2006-334283, filed on Dec. 12, 2006, the entire contents of which are incorporated herein by reference.

FIELD OF THE INVENTION

The present invention relates to a semiconductor memory device (EEPROM) comprising electrically erasable programmable memory cells, and more particularly to a technology for achieving a reduced rate of erroneous write in a NAND-type flash memory.

BACKGROUND OF THE INVENTION

A NAND-type flash memory has been known as an electrically erasable programmable and highly integrable memory (EEPROM). The NAND-type flash memory forms a NAND cell unit including a plurality of memory cells connected serially in such a manner that adjacent memory cells share a source/drain diffused layer. Both ends of the NAND cell unit are connected via respective selection gate transistors to a bit line and a source line, respectively. Such the configuration of the NAND cell unit allows for a smaller unit cell area and larger capacity storage than the NOR type.

A memory cell in the NAND-type flash memory has a charge accumulating layer (floating gate) formed on a semiconductor substrate with a tunneling insulator interposed therebetween, and a control gate layered on the floating gate with an intergate insulator interposed therebetween. It is operative to store data nonvolatilely in accordance with the state of charge accumulated in the floating gate. Specifically, a state with a higher threshold voltage after electrons are injected into the floating gate is used as data "0", for example, while a state with a lower threshold voltage after electrons are released from the floating gate is used as data "1", thereby storing binary data. Recently, a write threshold distribution has been fragmented to store multivalued data such as 4-valued one.

Writing data in the NAND-type flash memory is executed on a page basis with one page including all (or half of) memory cells arrayed along a selected word line. Specifically, writing is executed as operation to apply a write (program) voltage Vpgm to the selected word line to inject FN tunneling electrons from a cell channel into the floating gate. In this case, the potential on the NAND cell channel can be controlled from a bit line in accordance with write data "0", "1".

In the case of "0" write, Vss is applied to the bit line to transfer Vss via the turned-on selection gate transistor to the channel in the selected cell. In this case, a larger electric field is placed across the floating gate and the channel in the selected cell to inject electrons into the floating gate. On the other hand, in the case of "1" write (non-write), Vdd is applied to the bit line to charge the NAND cell channel up to Vdd−Vth (Vth is a threshold voltage of the selection gate transistor) to bring it into the floating state. In this case, the potential on the cell channel is elevated through capacitive coupling with the word line to inhibit injection of electrons into the floating gate.

If the cell channel voltage is boosted insufficiently in a Vpgm-given "1"-written cell (non-written cell), electrons are injected into the floating gate to cause an undesired threshold fluctuation (erroneous write). Non-selected word lines are usually given a write pass voltage (middle voltage) Vm lower than the write voltage Vpgm to control the channel voltage in the NAND cell unit, thereby preventing injection of electrons into the floating gate in the "1"-written cell. Sufficient channel boosting in the selected cell usually requires an increase in Vm, which contrarily causes weak write in non-selected cells in the NAND cell unit including a "0"-written cell and accordingly requires an optimization of Vm.

Until now, channel voltage control schemes on writing for preventing erroneous write in "1"-written cells and non-selected cells in the NAND-type flash memory have been proposed as follows.

(1) A self-boost (SB) scheme, which brings all channels in the NAND cell unit into the floating state on "1" writing to boost the channels with capacitive coupling with word lines.

(2) A local self-boost (LSB) scheme, which separates a channel in a selected cell from others on "1" writing to boost only that channel.

(3) An erase area self-boost (EASB) scheme, which is premised on sequential writing executed by writing to memory cells in turn from the source line side, and which separates the non-written area including the selected cell from the written area to boost the non-written area.

Even the use of such the channel voltage control schemes may cause a problem in accordance with further developed fine patterning of the NAND-type flash memory. The problem is associated with erroneous write in a cell adjacent to a selection gate transistor (in particular, the selection gate transistor close to the source line). On data writing, the selection gate transistor close to the source line is kept in the off state with the gate voltage of 0 V. If an adjacent cell is a "1"-written cell (non-written cell) given the write voltage Vpgm, a gate-induced drain leakage (GIDL) current occurs at the drain end of the selection gate transistor. In this case, erroneous write occurs such that electrons are injected into the floating gate in an adjacent non-written cell. Similar erroneous write may arise possibly if the cell adjacent to the selection gate transistor is given the write pass voltage Vm (<Vpgm).

Also in the cell adjacent to the selection gate transistor close to the bit line, similar erroneous write occurs.

To prevent the erroneous write due to the GIDL current, there are considered a design to suppress the GIDL current at the drain end of the selection gate transistor (for example, an improvement in channel profile), a design to suppress injection of hot electrons due to GIDL (for example, an elongated distance between the selection gate transistor and the memory cell), and so forth. These measures can not become effective solutions, however, if minimum process dimensions are increasingly made smaller.

For the above erroneous write, a scheme is effective to a certain extent, in which a dummy cell unavailable for data storage is arranged adjacent to the selection gate transistor. For example, it is disclosed in Japanese-Patent Laying-open publication No. 2006-186559, which is incorporated herein by reference.

The so-called soft-programming scheme has been known to dissolve an over-erased state in erased cells after collective erasing. For example, it is disclosed in Japanese Patent Laying-open publication No. 2006-59532, which is incorporated herein by reference. This scheme can narrow the threshold range of data as a whole and accordingly it is critical to preventing data from varying due to capacitive coupling between floating gates in adjacent cells. It is particularly critical as an anti-erroneous write technology in an increasingly fine-patterned NAND-type flash memory, and in a multivalued NAND-type flash memory, most of all.

SUMMARY OF THE INVENTION

A first aspect of the present invention provides a semiconductor memory device having a memory cell array configured by arranging a plurality of NAND cell units, said NAND cell unit comprises: a plurality of electrically erasable programmable nonvolatile memory cells connected serially; a first and a second selection transistor provided to connect both ends of the memory cells to a bit line and a source line, respectively; and dummy cells inserted in the NAND cell unit adjacent to the first and second selection transistors, respectively, wherein the dummy cells in said NAND cell unit are erased simultaneously with the memory cells under a weaker erase potential condition than that for the memory cells and set in a higher threshold distribution than an erased state of the memory cells.

A second aspect of the present invention provides a method of erasing data in a semiconductor memory device, the semiconductor memory device comprising a memory cell array of NAND cell units each including a plurality of electrically erasable programmable nonvolatile memory cells connected serially, and a first and a second selection transistor provided to connect both ends of the memory cells to a bit line and a source line, respectively, and dummy cells inserted in the NAND cell unit adjacent to the first and second selection transistors, respectively, the method comprising: prior to collectively erasing an erase unit in the memory cell array, executing preprogramming to elevate the threshold of the dummy cells in the erase unit; collectively erasing all memory cells in the erase unit including the dummy cells under a weaker erase potential condition for the dummy cells than that for the memory cells; and executing soft-programming for dissolving an over-erased cell in the erase unit.

A third aspect of the present invention provides a method of erasing data in a semiconductor memory device, the semiconductor memory device comprising a memory cell array of NAND cell units each including a plurality of electrically erasable programmable nonvolatile memory cells connected serially, and a first and a second selection transistor provided to connect both ends of the memory cells to a bit line and a source line, respectively, and dummy cells inserted in the NAND cell unit adjacent to the first and second selection transistors, respectively, the method comprising: collectively erasing all memory cells in an erase unit in the memory cell array including the dummy cells under a weaker erase potential condition for the dummy cells than that for the memory cells; executing writing to elevate the threshold of the dummy cells in the erase unit; and executing soft-programming for dissolving an over-erased cell in the erase unit.

A fourth aspect of the present invention provides a semiconductor memory device having a memory cell array configured by arranging a plurality of NAND cell units, said NAND cell unit comprises: a plurality of electrically erasable programmable nonvolatile memory cells connected serially; a first and a second selection transistor provided to connect both ends of said memory cells to a bit line and a source line, respectively; and a first dummy cell and a second dummy cell inserted in said NAND cell unit adjacent to said first and second selection transistors, respectively, wherein a first voltage is applied to said first dummy cell prior to apply a second voltage to said second dummy cell in a programming for said memory cell.

BRIEF DESCRIPTION OF THE DRAWINGS

FIG. 8 is a diagram showing relations between positions of selected word lines and write voltages in the flash memory in accordance with one embodiment of the present invention.

FIG. 9 is a diagram showing further relations between positions of selected word lines and write voltages in the flash memory in accordance with one embodiment of the present invention.

FIG. 10 is a diagram showing relations between positions of selected word lines and write voltages in the flash memory of prior art for comparison.

FIG. 16A is a diagram showing variations in threshold in regular cells on erasing in accordance with one embodiment of the present invention.

FIG. 16B is a diagram showing variations in threshold in dummy cells on erasing in accordance with one embodiment of the present invention.

FIG. 17 is a diagram showing a voltage applying method on erase verifying in the sequence in accordance with one embodiment of the present invention.

FIG. 19 is a diagram showing a voltage applying method on soft programming in the sequence in accordance with one embodiment of the present invention.

FIG. 22 is a diagram showing operating voltages in summary on application of the sequence in accordance with one embodiment of the present invention.

FIG. 26 is a diagram showing operating voltages in summary on application of the second erase sequence in accordance with one embodiment of the present invention.

DETAILED DESCRIPTION OF THE EMBODIMENTS

The embodiments of the invention will now be described with reference to the drawings.

Figure 1:
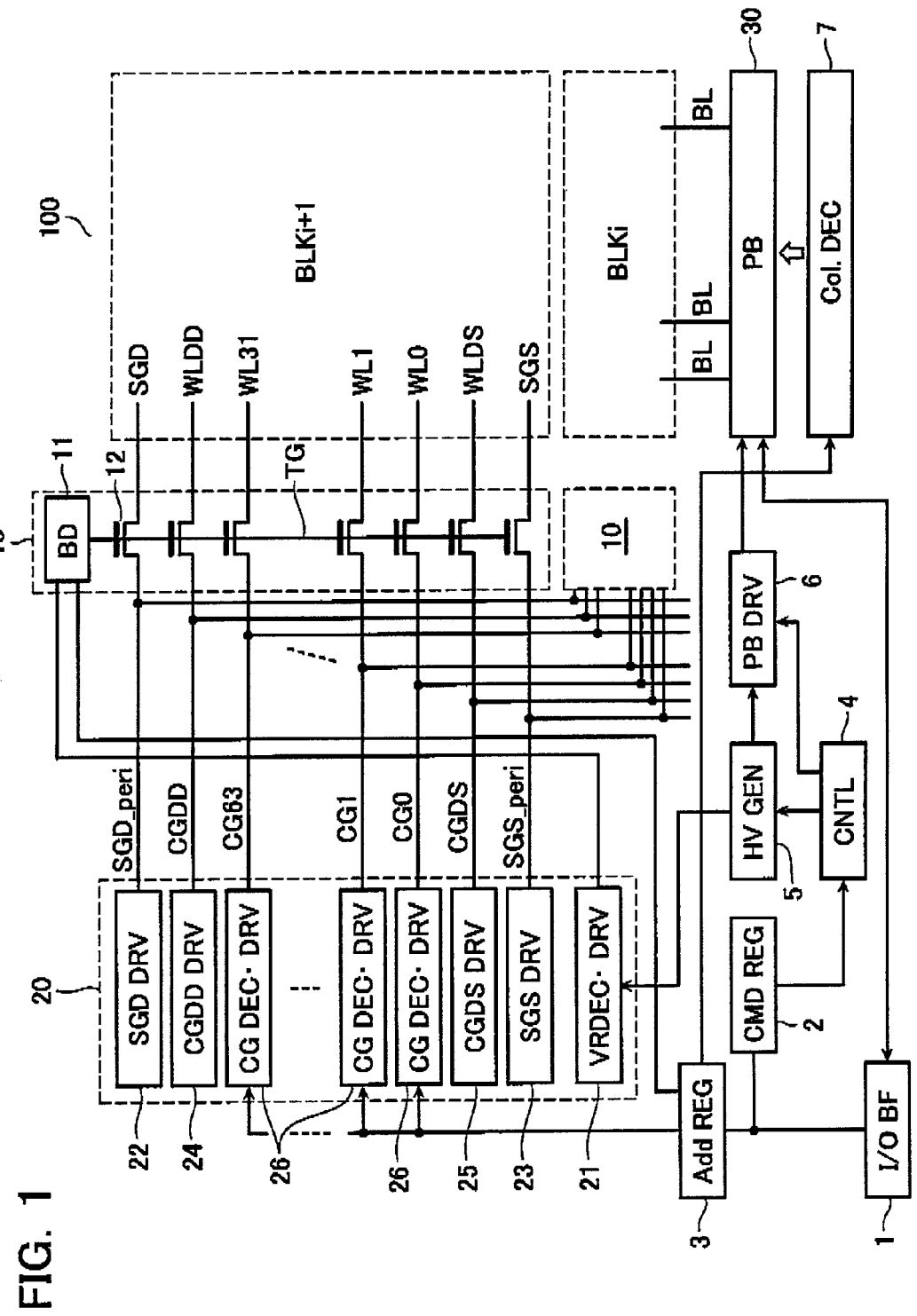
FIG. 1 is a diagram showing a configuration of a NAND-type flash memory in accordance with one embodiment of the present invention.
Figure 2:
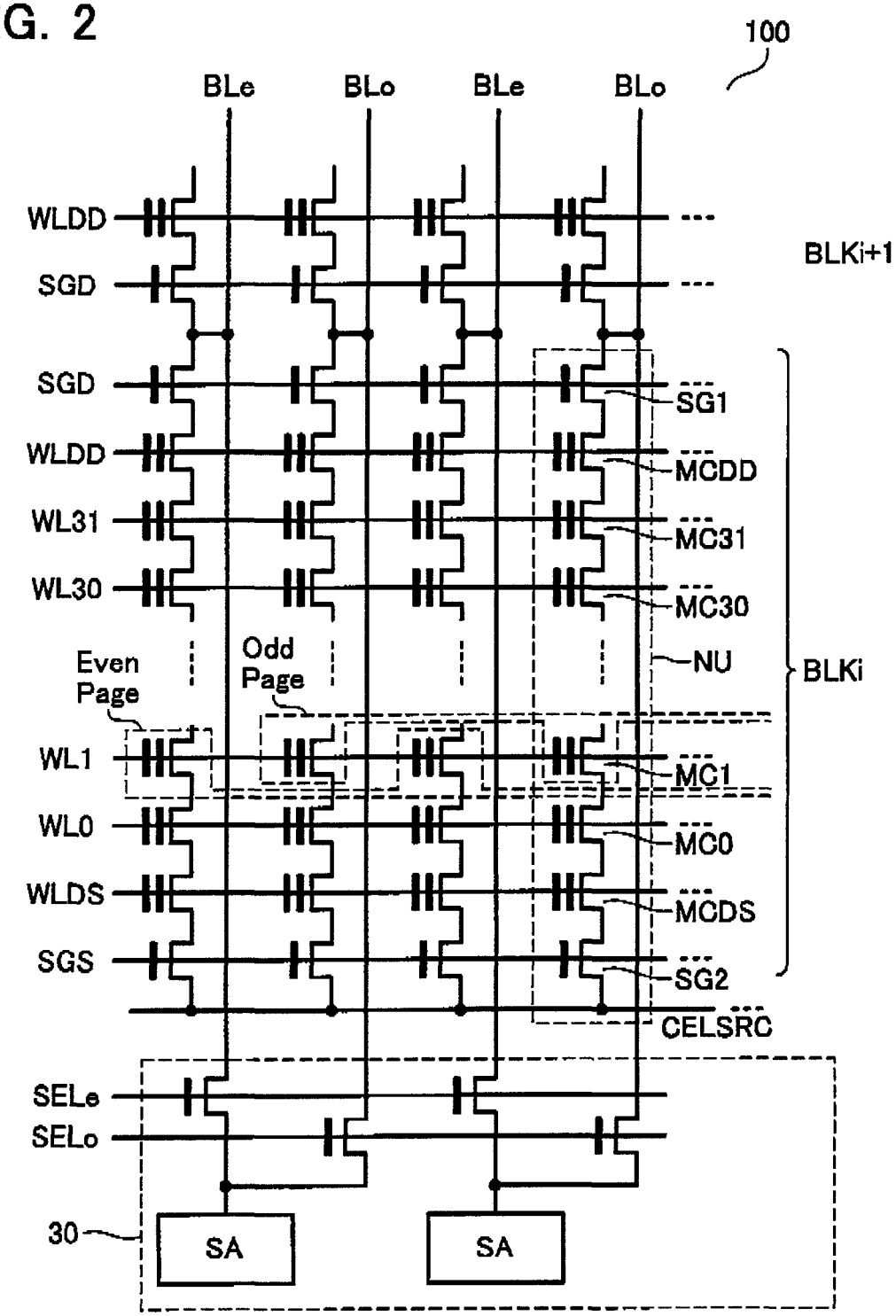
FIG. 2 is a diagram showing a configuration of a memory cell array in the flash memory cell in accordance with one embodiment of the present invention.

FIG. 1 is a brief diagram of the whole configuration of a NAND-type flash memory according to the embodiment. FIG. 2 shows an equivalent circuit of a memory cell array 100 therein. The NAND-type flash memory has a basic unit or NAND cell unit (NAND string) NU, which fundamentally includes a plurality of memory cells MC0-MC31 connected serially, and two selection transistors SG1, SG2 arranged at both ends thereof.

In this embodiment, "dummy cells" MCDD, MCDS unavailable for data storage are inserted adjacent to the selection gate transistors SG1, SG2, respectively. The dummy cells MCDD, MCDS are configured similar to the other normal memory cells MC0-MC31 except that they can not be accessed with normal address inputs. Hereinafter, the normal memory cells MC0-MC31 may also be referred to as "regular cells" in comparison with the dummy cells.

The NAND cell unit NU has one end connected via the selection transistor SG1 to a bit line BL and the other end connected via the selection transistor SG2 to a common source line CELSRC in the memory cell array 100.

One memory cell includes an N-type source/drain diffused layer formed in a P-type well on a silicon substrate and has a stacked gate structure containing a floating gate or charge accumulating layer and a control gate. The amount of charge held in the floating gate can be varied through writing and erasing, thereby changing the threshold of the memory cell to store 1-bit data or multi-bit data.

Instead of the memory cell scheme having the floating gate as the charge accumulating layer, a memory cell having a charge accumulating layer (charge trap) composed of an insulator in a gate insulating film may also be used.

The regular cells MC0-MC31 and dummy cells MCDD, MCDS in the NAND cell unit NU have respective control gates, which are connected to different regular word lines WL0-WL31 and dummy word lines WLDD, WLDS. The selection gate transistors SG1, SG2 are connected to selection gate lines SGD, SGS, respectively.

A set of NAND cell units sharing the regular word lines WL0-WL31, the dummy word lines WLDD, WLDS and the selection gate lines SGD, SGS configures a unit of collective data erasing or a block BLK. In general, plural blocks BLKi, BLKi+1, . . . are arranged along the bit line as shown.

The NAND-type flash memory achieves various operations with command inputs. For example, in writing, a data load command is latched from an I/O circuit 1 to a command register 2, and a write address command is latched via the I/O circuit 1 to an address register 3. Subsequently, write data is loaded via the I/O circuit 1 to a sense amp circuit (and write circuit) 30. Thereafter, when a write execution command is latched via the I/O circuit 1 to the command register 2, writing is automatically started in the interior.

Once the write execution command is fed, a sequence controller circuit 4 starts operation. In writing, the sequence controller circuit 4 is operative to control voltages required for writing, to control timings of write pulse applying and verify reading, and to control repetition of write pulse applying and verify reading until an operation of desired writing is completed.

Under the control of the sequence controller circuit 4, a high-voltage generator circuit 5 generates the write voltage Vpgm, the write pass voltage Vpass, and other high voltages (boosted voltages) required in a row-related signal driver circuit 20 and a page buffer control circuit 6.

The row-related signal driver circuit 20 includes: CG decoders/drivers 26, which are operative to control word line voltages and are equal in number to the word lines in the NAND cell unit; an SGD driver 22 operative to control the drain-side selection gate line SGD; an SGS driver 23 operative to control the source-side selection gate line SGS; CGDD and CGDS drivers 24, 25 operative to drive the dummy word lines WLDD, WLDS; and a VRDEC driver 21 operative to provide a boosted supply voltage VRDEC for the block decoder. These drivers 21-26 are shared among plural blocks in the memory cell array 100.

The NAND-type flash memory requires plural voltages to be applied to plural word lines in a selected NAND cell unit for operation. Accordingly, among row addresses, a page address is fed to each of the CG decoders/drivers 26 to select the word lines in the NAND cell unit.

Each block in the memory cell array 100 has a word line end, which is provided with a row decoder 10, in a narrow sense, having a block selecting function. The row decoder 10 includes a block decoder 11 operative to receive a block address from the address register 3 to decode it. The row decoder also includes an array of transfer transistors 12, which are controlled in common by the output from the block decoder 11 to transfer voltages required for writing, erasing and reading to word lines and selection gate lines in a selected block. The block decoder 11 includes a level shifter circuit operative to provide a desired voltage to a common gate TG of the transfer transistors 12.

The transfer transistors 12 are connected at one end to the outputs of the drivers 21-26 and at the other end to word lines, dummy lines and selection gate lines in the cell array 100. For example, write pulse applying requires the write voltage Vpgm (around 20 V) to be applied to a selected word line. At the same time, Vpgm+Vt (Vt is a voltage corresponding to the threshold of the transfer transistors 12) supplied from the VRDEC driver 21 is applied to the common gate TG of the transfer transistors 12.

The NAND-type flash memory uses FN tunneling current in writing and erasing. Particularly, in writing, an extremely small current is required for threshold shift in one memory cell, different from the NOR-type memory cell. Accordingly, a number of memory cells can be subjected to simultaneous writing. Therefore, a batch process unit for writing and reading or a page length can be made as large as 2 Kbytes or 4 Kbytes. The sense units SA in the sense amp circuit 30 that configure a page buffer are contained same as the page length in number.

In loading write data, for example, a column decoder 7 decodes a column address sent from the address register 3, then connects the I/O circuit 1 with a selected sense unit SA, and sets write data at each column address in the sense amp circuit 30. In reading, in reverse, data collectively read out into the sense amp circuit 30 is fed to the I/O circuit 1 from the sense unit SA selected in accordance with the column address.

Although it is omitted from FIG. 1, a circuit is incorporated between the I/O circuit 1 and the page buffer 30 in practice to realize the input/output of data at a certain cycle. A specific circuit of the sense unit SA is disclosed, for example, in Japanese Patent Laying-open publication No. 2001-325796, which is incorporated herein by reference.

FIG. 2 shows an example of sharing one sense amp SA between an even bit line BLe and an odd bit line BLo. On writing or reading, an even bit line BLe and an odd bit line BLo are selectively connected to the sense amp SA in accordance with selection signals SELe, SELo. At the same time, non-selected bit lines are served as shield lines to prevent interference between bit lines.

In this sense amp scheme, in which the word line WL1 of FIG. 2 is selected as shown, memory cells selected by one word line and all even bit lines BLe configure a unit of simultaneous writing or reading, that is, a page (even page). In addition, memory cells selected by one word line and all odd bit lines BLo configure a unit of simultaneous writing or reading, that is, another page (odd page).

As described above, the dummy word lines WLDD, WLDS are not selectively accessed as the regular word lines WL0-31. Therefore, in the row-related signal driver circuit 20, the decoders/drivers (CGDEC/DRV) 26 for driving regular word lines are different from the drivers (CGD DRV, CGS DRV) 24, 25 for driving dummy word lines. This is because, basically, the former include decoders operative to decode a word line address of 5 bits or 6 bits while the latter include no such decoders.

Figure 3A:
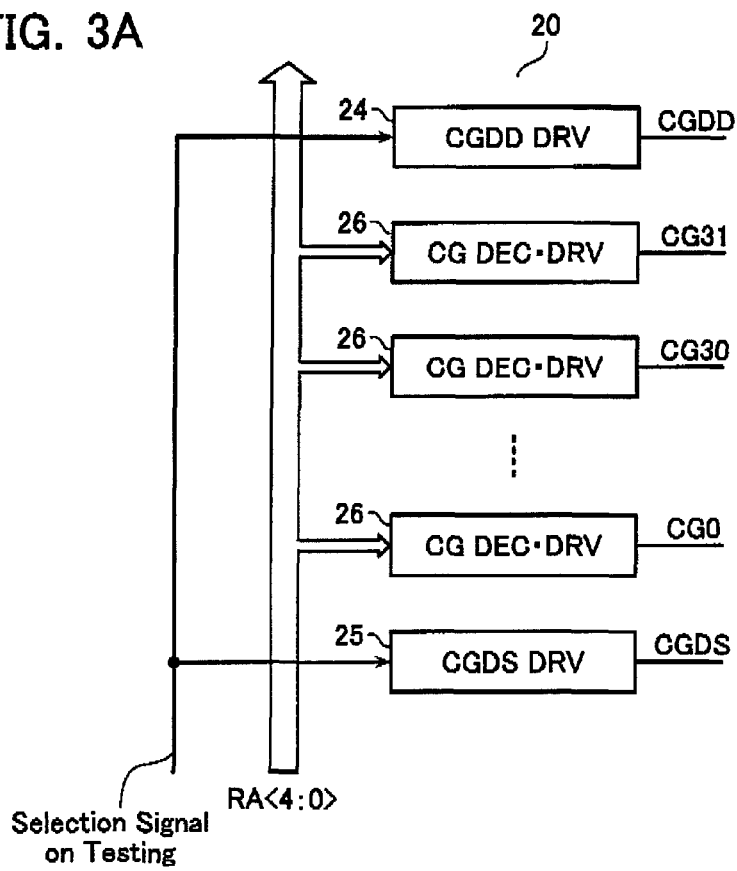
FIG. 3A is a diagram showing a configuration of an address signal input unit of a row decoder in the flash memory cell in accordance with one embodiment of the present invention.

FIG. 3A specifically shows a difference between address signal inputs to the decoders/drivers (CGDEC/DRV) 26 for driving regular word lines and to the drivers (CGD DRV, CGS DRV) 24, for driving dummy word lines. For example, if an address signal for use in selecting one of 32 word lines is RA<4:0>, the decoders/drivers (CGDEC/DRV) 26 include decoders operative to decode the address signal RA<4:0>.

On the other hand, the drivers (CGD DRV, CGS DRV) 24, 25 for driving dummy word lines are not given normal address signals and controlled active whenever the concerned block is selected. On testing that requires selection of dummy word lines, they are controlled to receive a selection signal on testing based on the commands and so forth (or another exclusive address signal or the like).

Figure 3B:
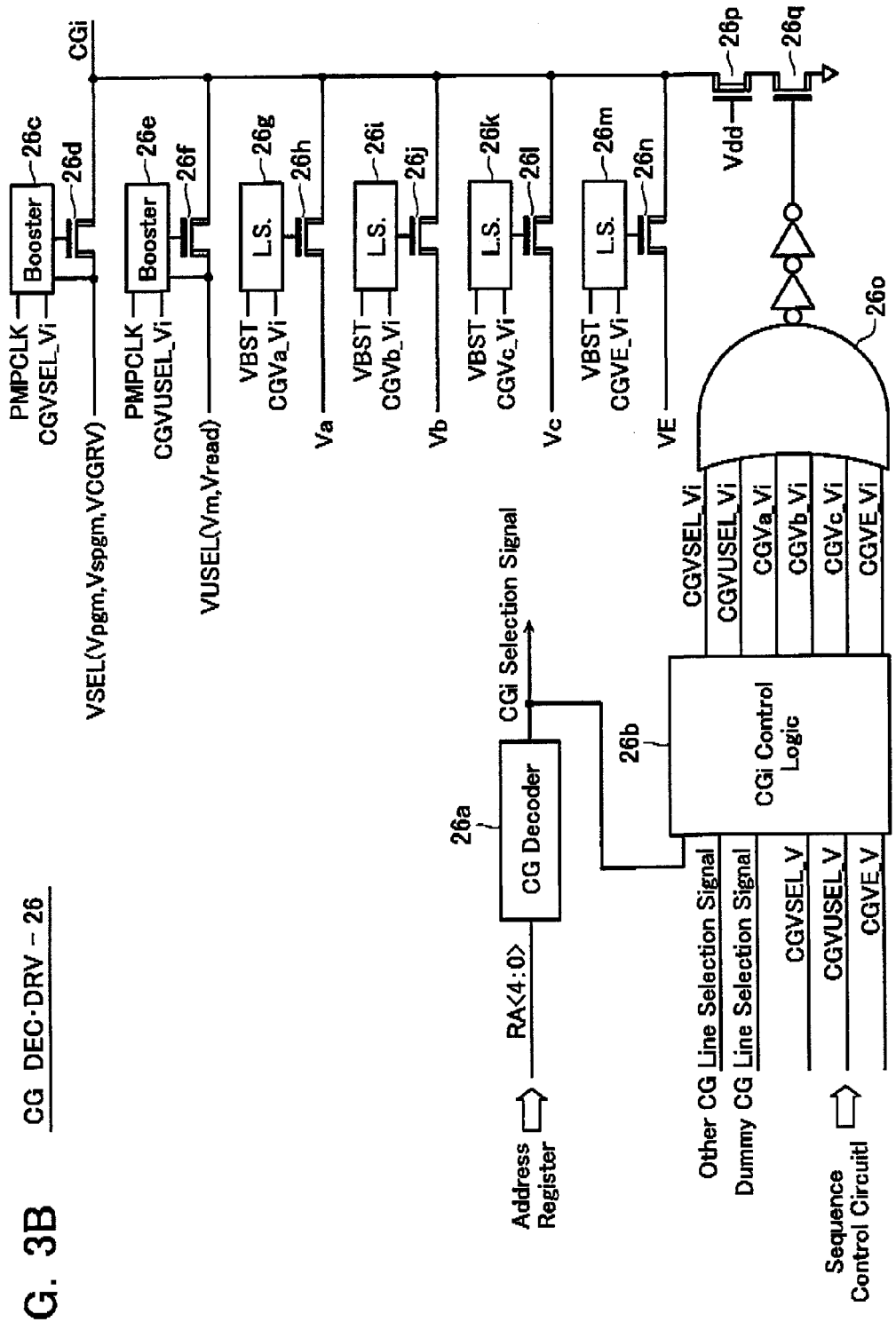
FIG. 3B is a diagram showing a configuration of a driver unit in the row decoder corresponding to a regular word line in accordance with one embodiment of the present invention.
Figure 3C:
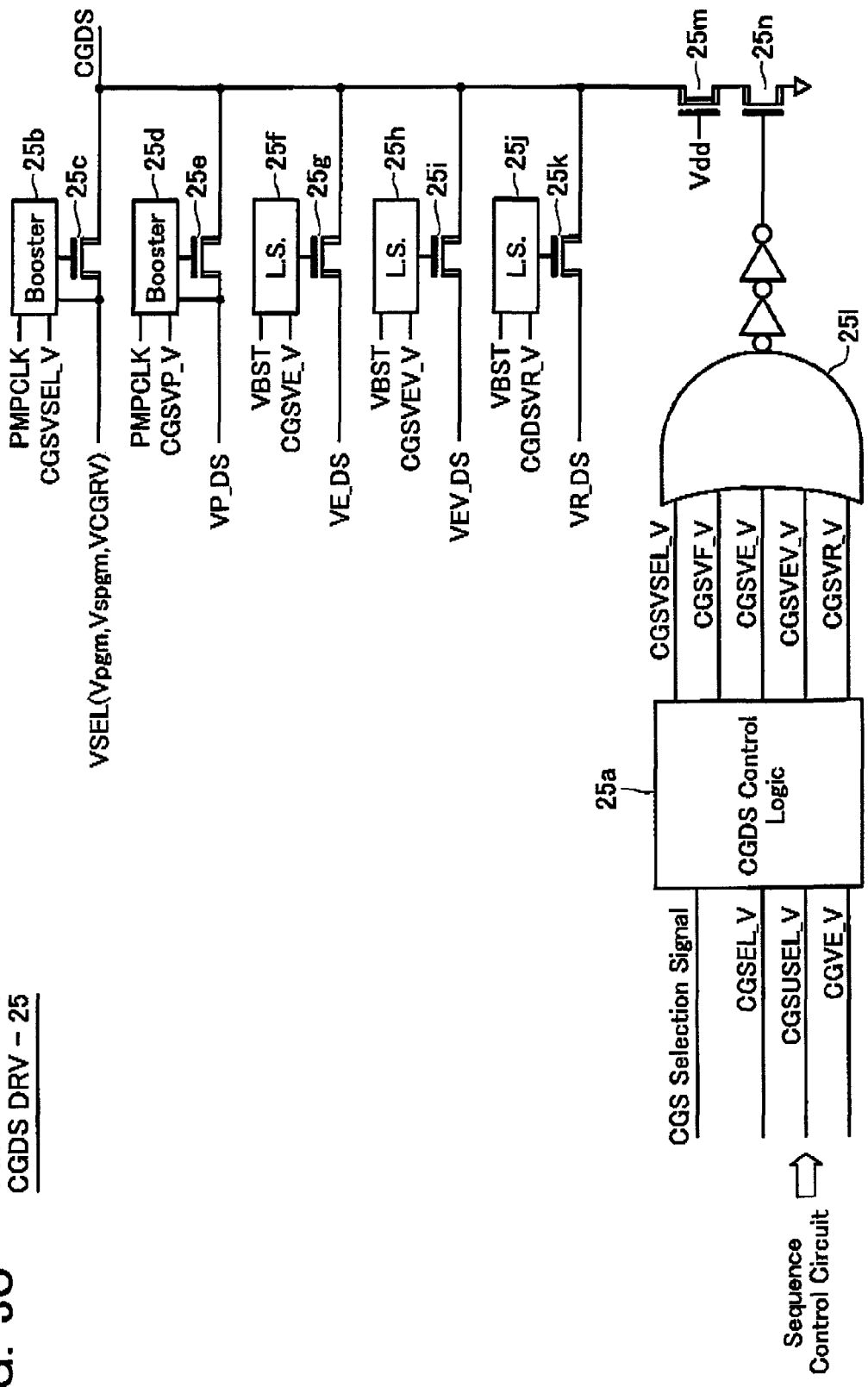
FIG. 3C is a diagram showing a configuration of a driver unit in the row decoder corresponding to a dummy word line in accordance with one embodiment of the present invention.

FIGS. 3B and 3C show specific examples of configurations of the decoder/driver (CGDEC/DRV) 26 for driving a regular word line and the driver (CGD DRV, CGS DRV) 24, 25 for driving a dummy word line.

For the purpose of providing a certain voltage at a certain timing in accordance with a selected/non-selected state of a word line WLi in each operation, the driver 26 in FIG. 3B includes a decoder 26a for identifying a selected/non-selected state of the word line WLi. It also includes a CGi logic control circuit 26b for providing a certain voltage at a certain timing based on a selection/non-selection signal from the decoder, and a group of switch circuits 26c-26q for receiving control signals from the control circuits and providing various voltages.

The decoder 26a decodes the address signal RA<4:0> output from the address register to identify a word line address in the NAND string and transmits a selection/non-selection signal to the CGi control logic circuit in each CG driver circuit. The number of bits in RA is equal to 5-bit for a 32 NAND string including 32 serially connected cells, and 6-bit for a 64 NAND string including 64 serially connected cells.

In later-described page writing, in accordance with the position of a selected word line in the NAND string, a voltage for non-selection may be applied. Accordingly, the output from the CG decoder 26a is provided not only to its own control line CGi but also over plural CG drives.

The CCi control logic circuit 26b receives a control signal CGSELV for selected word lines or a control signal CGUSELV for non-selected word lines output from the sequence controller circuit, refers to its own selected/non-selected state, and controls the group of switch circuits 26c-26q.

Among the group of switch circuits, booster circuits 26c, 26e attached to transfer gates 26d, 26f are small-scale booster circuits including NMOS transistors and capacitors, for example, though the details are not shown. Therefore, a pumping clock signal PMPCLK and a voltage to be transferred are fed thereto. On the other hand, circuits 26g, 26i, 26k, 26m attached to transfer gates 26h, 26j, 26l, 26n are level shifters of the general cross-coupling type that includes high-voltage transistors and receives VBST as a high potential power supply.

For example, on page writing, if the CGi driver is selected, CGVSEL_Vi exhibits a waveform synchronized with the control signal CGSELV from the sequencer while CGUSEL_Vi, CGVa_Vi, CGVb_Vi, CGVc_Vi, and CGVE_Vi remain at "L". When CGVSEL_Vi turns to "H", the booster circuit 26c boosts the voltage on the gate of the high-voltage transistor 26d to transfer Vpgm applied to VSEL to CGi. In the non-selected state on writing, the rule of write pulse voltage application and the position of the selected word line determine any one of VUSEL, Va, Vb, Vc to be provided to external.

CGVE_Vi a control signal for use in providing VE to regular word lines. This is not required always if VE is fixed at 0 V.

The voltage transfer gates (26d, 26f, 26h, 26j, 26l, 26n) in the switch circuits and the transistor 26p in the ground path use high-voltage transistors because the write voltage Vpgm is applied to CGi. Particularly, in the Vpgm discharge path, the high-voltage transistor 26p of the depletion type and the high-voltage transistor 26q of the enhancement type are connected in series. This measure is taken to relieve the drain-source voltage applied to one transistor.

FIG. 3C shows an example of the driver 25 for the control line CGDS corresponding to the dummy word line WLDS. The circuitry is similar to the CG driver circuit in FIG. 3B without the decoder circuit. The circuitry includes a CGDS control logic circuit 25a, and a group of switch circuits 25b-25n operative under the control of the output from the logic circuit, thereby providing certain voltages for the dummy word line in reading, writing and erasing.

Although usually treated as a non-selected word line for a regular cell, the dummy word line is also configured available for writing and verifying in certain operations as a selected word line using the voltage VSEL applied to the selected word line as described later. Namely, in operations determined by the sequence, it operates as a selected word line in accordance with the CGS selection signal output from the sequence control circuit. Alternatively, the CODS selection signal may be selected together with an address input in a test mode and so forth. This case is limited such that a command to select the dummy word line and a certain row address input can establish an AND logic.

The driver circuit for the control line CGDD corresponding to the dummy word line WLDD is not shown though it is almost same in configuration as the CGDS-side driver circuit in FIG. 3C, but slightly different in output voltages and control timings.

Figure 4:
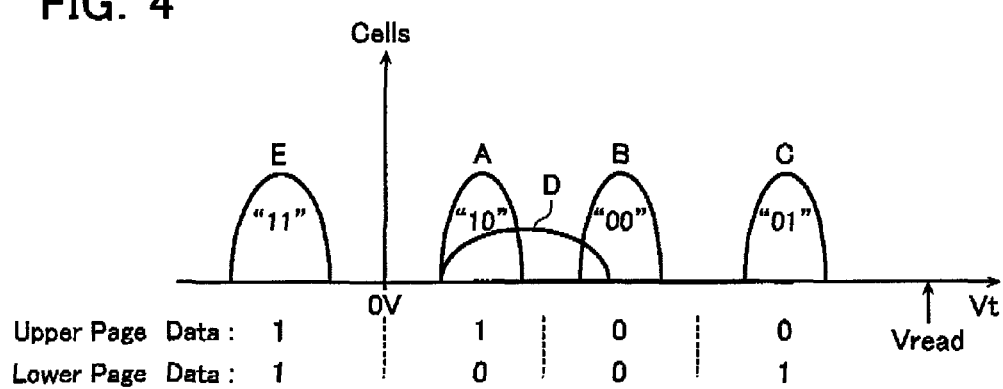
FIG. 4 is a diagram showing a 4-valued data threshold distribution in the flash memory in accordance with one embodiment of the present invention.

FIG. 4 shows an example of the data threshold distribution when the NAND-type flash memory of the embodiment is used for 4-valued storage. Regular cells are set in any data state of a negative threshold state E and three positive threshold states A, B, C. These data states correspond to 4-valued data E=(1,1), A=(1,0), B=(0,0), C=(0,1).

A threshold state D in a dummy cell is desired to have as narrow a distribution as possible within a positive threshold range.

Figure 5:
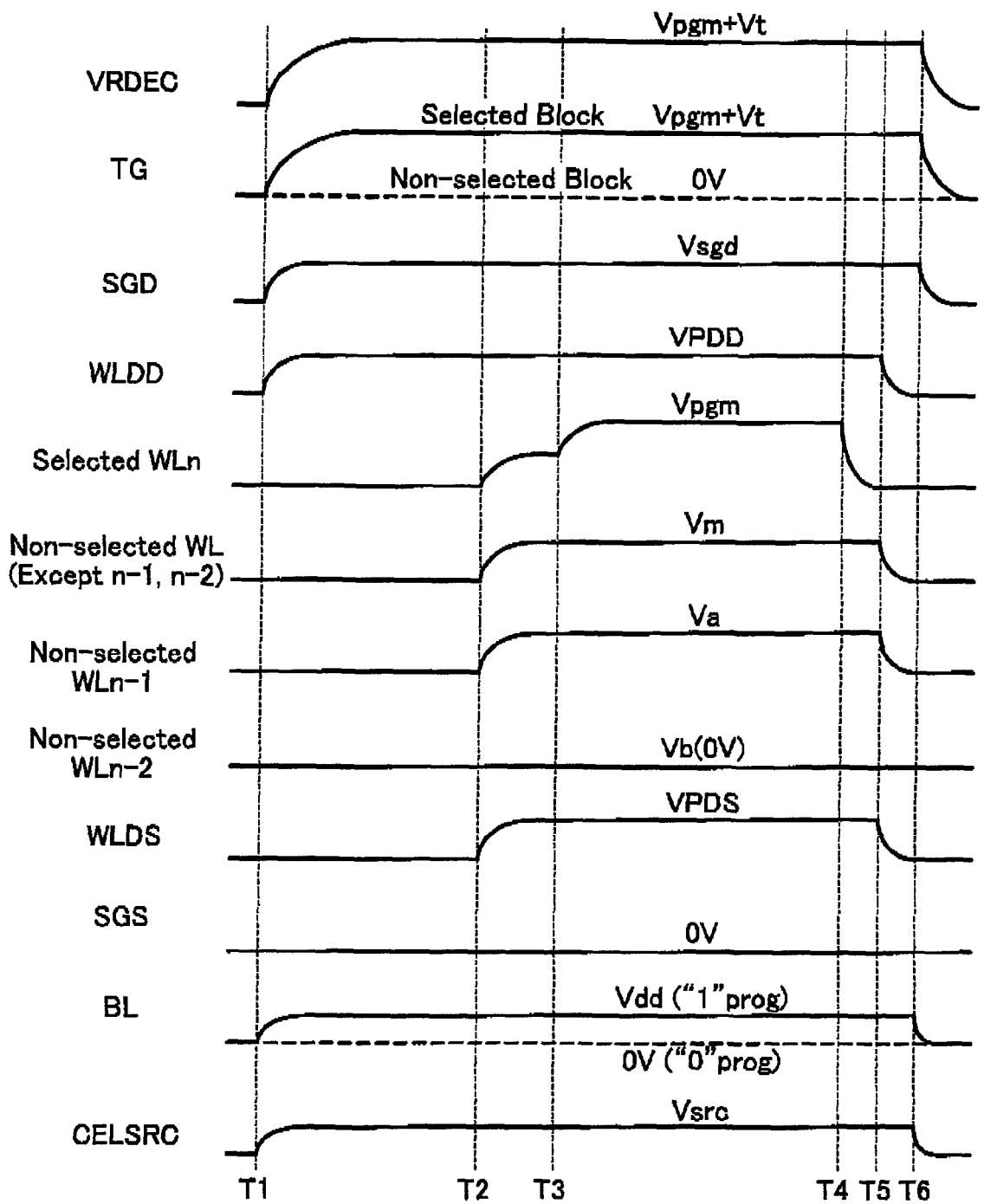
FIG. 5 is a diagram showing voltage waveforms on writing in the flash memory in accordance with one embodiment of the present invention.

FIG. 5 shows voltage pulse waveforms on writing when the dummy cell has the positive threshold state D as described above. The dummy cell is set to a certain positive threshold before writing in the regular cells MC0-31 as described later. Therefore, as shown in FIG. 5, a voltage VPDD is applied to the dummy word line WLDD prior to other regular word lines, which voltage is sufficient to reliably turn on the dummy cell.

From timing T1 to T2, the write potential applied to the bit line is transferred to the regular cell. After timing T2, the write voltage Vpgm is given to the selected regular word line WLn. In addition, the middle voltage (write pass voltage) Vm (<Vpgm) is given to non-selected regular word lines, and the voltages Va, Vb (Vb<Va<Vm) are given to non-selected regular word lines WLn-1, WLn-2 close to the selected regular word line WLn at the source-line side, respectively. The voltage Vb is a channel separation voltage, which is 0 V, for example. This case is shown with the use of the EASE scheme as the channel boost scheme.

Thus, in a "0"-written cell, 0 V is transferred to the selected cell channel and writing is executed using FN tunneling current. In a "1"-write cell (non-write cell), the channel and diffused layer region in the NAND string are boosted by coupling with word lines, and writing is not caused.

Figure 6:
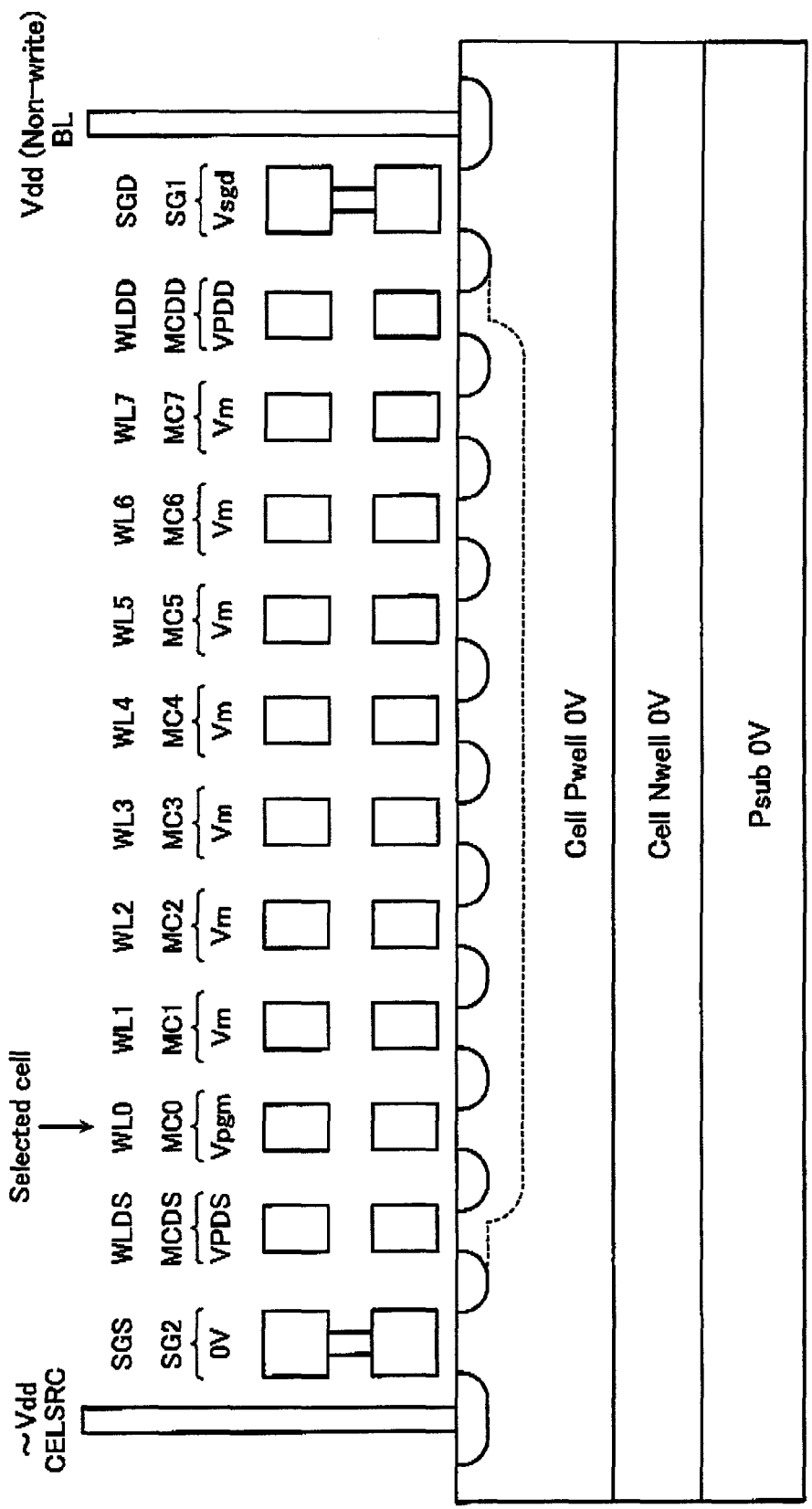
FIG. 6 is a diagram showing a voltage application condition in a NAND unit on writing in the flash memory in accordance with one embodiment of the present invention.
Figure 7:
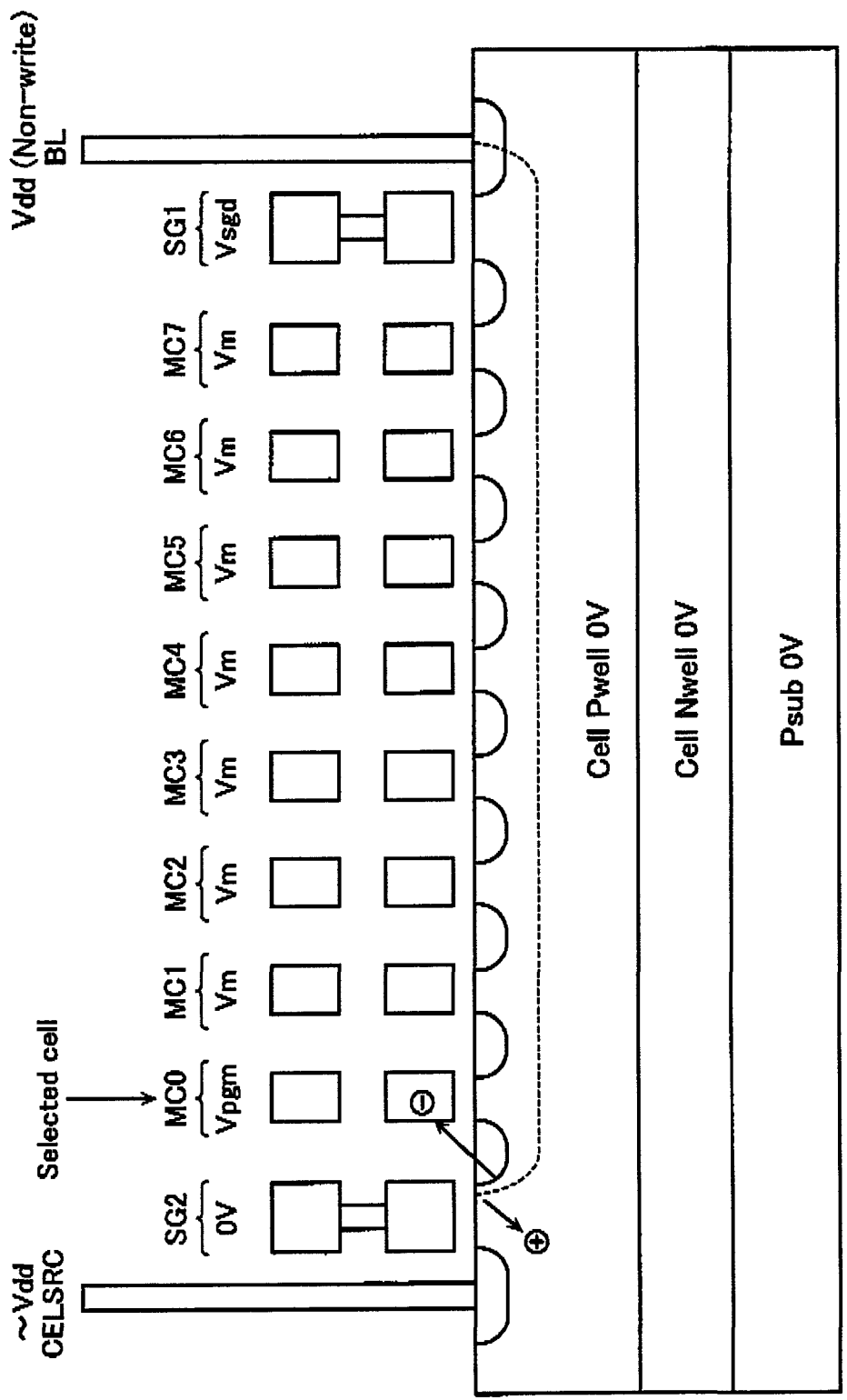
FIG. 7 is a diagram showing a voltage application condition in a NAND unit on writing in a flash memory of prior art.

FIG. 6 shows a write voltage-applied condition in section of a NAND string in the case of non-write ("1"-write) when the regular word line WL0 closest to the source line CELSRC is selected. FIG. 7 shows a voltage-applied condition for reference in the case of non-write when the dummy cells MCDD, MCDS are not provided and the regular word line WL0 is similarly selected. These exemplify the case of 8 regular word lines, which is though merely an example to the last.

In an example of prior art of FIG. 7, 0 V is applied to the selection gate transistor SG2 at the source-line side and the write voltage Vpgm to the regular cell MC0 adjacent thereto. As a result, GIDL current flows at the drain end of the selection gate transistor SG2 to inject electrons into the regular cell MC0, which may cause erroneous write possibly.

On the contrary, as shown in FIG. 6, insertion of the dummy cell MCDS adjacent to the selection gate transistor at the source-line side can prevent erroneous write from occurring in the regular cell MC0. Namely, the relation between VPDS applied to the dummy word line WLDS and the threshold voltage of the dummy cell MCDS determines the channel potential on the dummy cell portion. This channel potential can be made lower than the channel potential on the regular cell region such that the boosted channel potential is lowered in stages from the regular cell toward the selection gate transistor SG2. This makes it possible to suppress GIDL not only at the dummy cell portion adjacent to the regular cell but also at the selection gate transistor SG2, and easily suppress occurrences of GIDL that cause erroneous write.

VPDS can take an optimal value in accordance with the threshold voltage of the dummy cell MCDS. Accordingly, it may be same as Vm, Va, Vb shown in FIG. 5. Alternatively, it may be a finely adjustable voltage generated for dummy cells.

In writing in the memory cell MC0 connected to the regular word line WL0, the threshold voltage of the dummy cell MCDS may be either negative or positive. In comparison, when the threshold voltage is negative, the voltage on the dummy word line WLDS to be optimized is lower than when the threshold voltage is positive. A write characteristic of the memory cell MC0 is considered herein. If the voltage applied to the dummy cell MCDS is lower, coupling with the associated word line results in a delayed write characteristic of the regular cell MC0 and requires a higher write voltage than memory cells not adjacent to the dummy cell require. In accordance with fine patterning, the distance between word lines has been reduced generation by generation and the electric field across lines has been concerned. Therefore, the threshold voltage of the dummy cell MCDS is preferably positive rather than negative on one hand.

The dummy cell MCDD at the bit-line side is similarly operative to prevent GIDL. The voltage VPDD applied to the dummy word line WLDD associated with the dummy cell MCDD at the bit-line side may be same as or different from the voltage VPDS on the dummy word line WLDS at the source-line side.

FIG. 8 shows relations among voltages on the regular word lines WL0-WL7, the dummy word lines WLDS, WLDD and the selection gate lines SGS, SGD in summary in relation to the positions of selected word lines for the write voltage applying method described in FIG. 5.

FIG. 9 shows an example in which voltages Va, Vb, Vc (Vc<Vb<Va) are applied to non-selected word lines adjacent to a selected word line at the source-line side to achieve a much easier electric field than the example of FIG. 8.

A write voltage applying method of prior art without dummy cells is shown in FIG. 10 in relation to FIGS. 8 and 9. In FIG. 10, a portion surrounded by a thick framework indicates a higher possibility of causing erroneous write due to GILD. The corresponding portions in FIGS. 8 and 9 can relieve the electric field and prevent erroneous write.

In an erase sequence for erasing on a block basis, dummy cell threshold control is executed to elevate the threshold voltage of the dummy cell. As a result, when the regular word line WL0 at the source-line side is selected, the potential difference between the regular word line WL0 and the dummy word line WLDS adjacent thereto can be reduced. Similarly, when the regular word line WL7 at the bit-line side is selected, the potential difference between the regular word line WL7 and the dummy word line WLDD adjacent thereto can be reduced.

Examples of such the erase sequence are described below specifically.

[First Erase Sequence]

Figure 11:
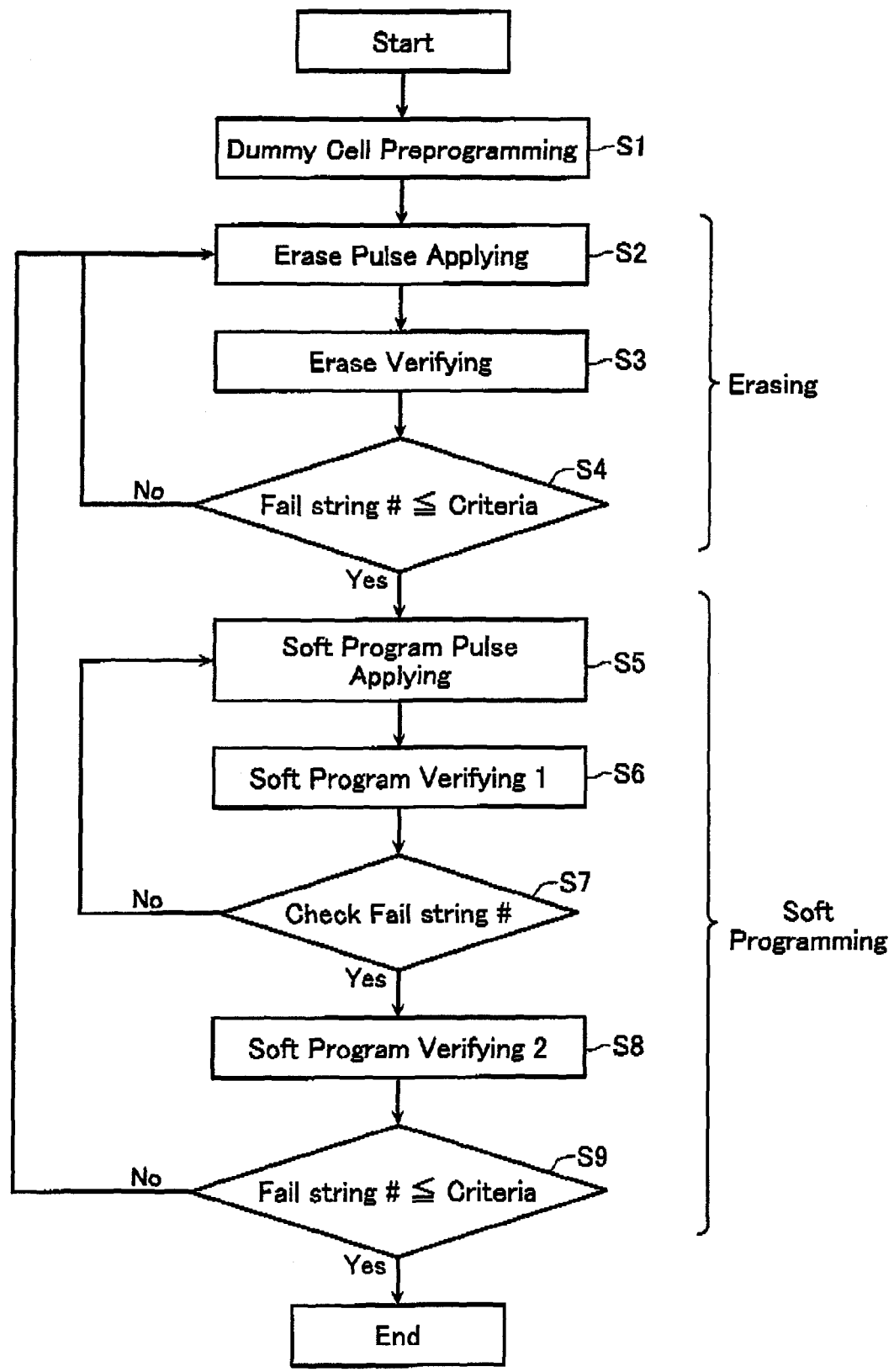
FIG. 11 is a diagram showing a flow of a first erase sequence in accordance with one embodiment of the present invention.

FIG. 11 shows a first erase sequence. As shown, at the start of the erase sequence, preliminary programming (preprogramming) is executed to the dummy cells (step S1). The preprogramming to the dummy cells only includes applying one pulse.

Next, an erase pulse is applied to a selected block (step S2) and then erase verifying is executed (step S3). In this case, erasing is executed to regular cells and dummy cells at the same time in the erase unit, that is, in the selected block with applying different voltages to the regular word lines and to the dummy word lines. The detail will be described later though erase verifying is disclosed, for example, in Japanese Patent Laying-open publication No. 2005-116102, which is incorporated herein by reference.

A decision on completion of erase (step S4) is made by checking data in the sense amp and page buffer after erase verifying to determine whether the number of NAND strings corresponding to erase Fail is equal to or lower than a certain number.

Next, soft programming is executed for the following reason. In the regular cell, in particular, in the NAND flash memory of the floating gate type, it is important to reduce the potential difference between the erase threshold and the uppermost level of the write threshold.

Namely, as shown in FIG. 11, soft-program pulse applying is executed (step S5), and then soft-program verifying is executed at step S6, S8 in two stages. The first soft-program verifying step S6 is to determine whether or not the threshold is written up to a certain level. The second soft-program verifying step S8 is to finally determine whether the threshold distribution after soft programming finished at the decision level of step S6 does not exceed a certain threshold level.

If the step S7 of decision on the read result at the first verifying step S6 results in Fail, soft programming is executed again. If the step S9 of decision on the second verifying step S8 results in Fail, the control returns to the erase cycle as erase failed.

Operation of each step is described next specifically.

Figure 12:
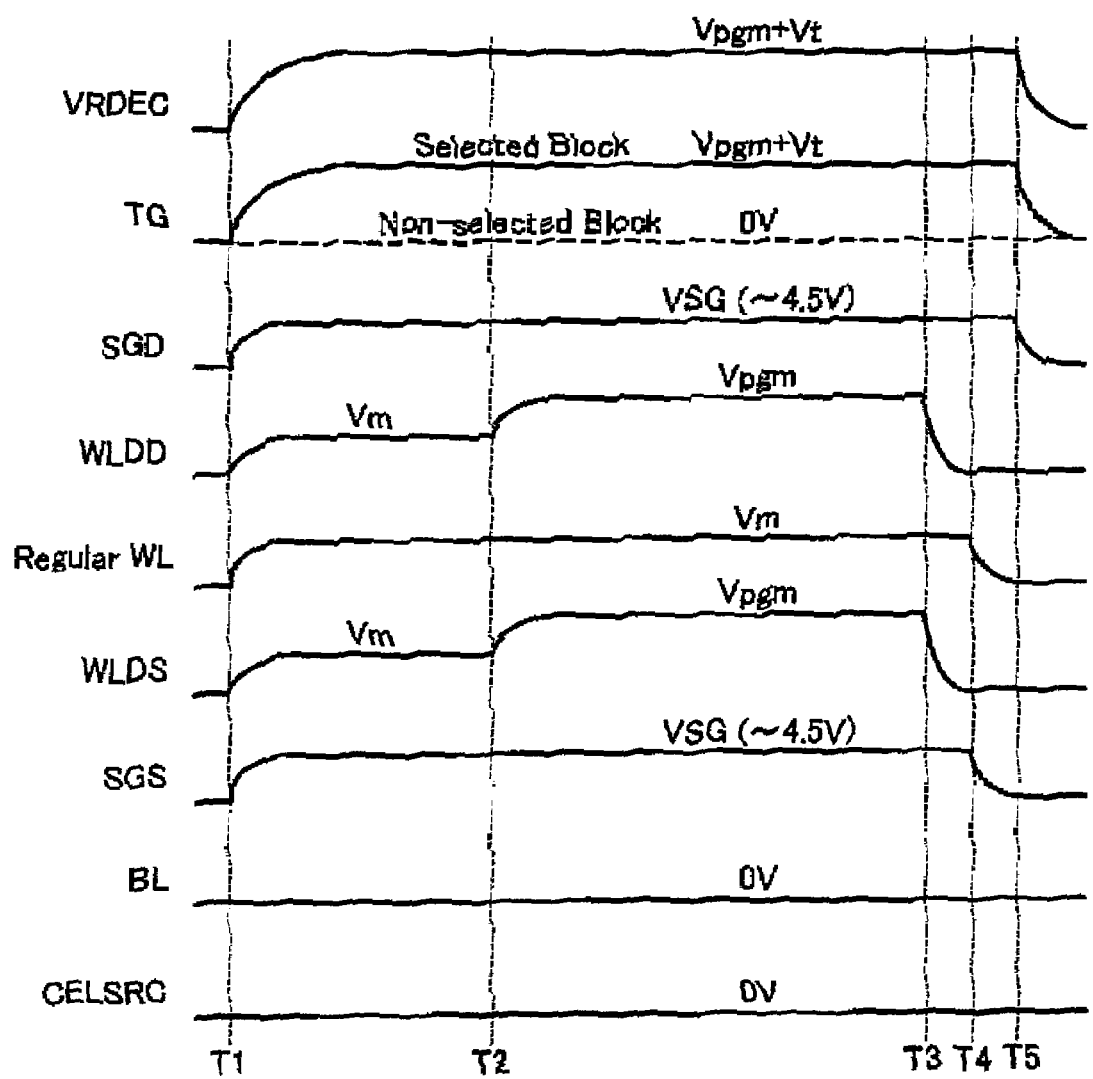
FIG. 12 is a diagram showing operating waveforms on preprogramming dummy cells in the sequence in accordance with one embodiment of the present invention.

FIG. 12 shows write voltage waveforms in the step S1 of preprogramming the dummy cells. The pulse voltage Vm unavailable for write is applied to the regular word lines while the write voltage Vpgm is applied to the word lines (dummy word lines) WLDD, WLDS associated with the dummy cells. The write voltage Vpgm is not same as that on normal regular cell writing but may be a write voltage that shifts the threshold of the dummy cell somewhat, such as one that can barely write the data state A.

The selection gates SGD, SGS are supplied with VSS (about 4.5 V) while the bit line BL and the source line CELSRC are kept at 0 V. This selection gate line voltage sets a smaller potential difference between the dummy word lines WLDD, WLDS and the selection gate lines SGD, SGS.

Figures 13, 14:
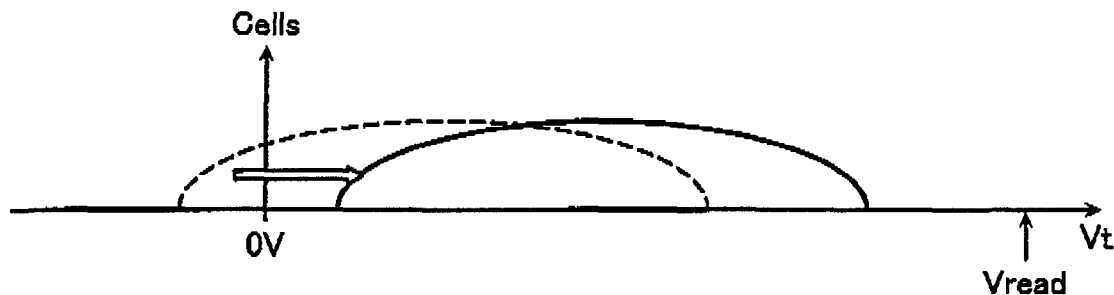
FIG. 13 is a diagram showing variations in threshold in dummy cells by preprogramming in accordance with one embodiment of the present invention.
FIG. 14 is a diagram showing voltage applying methods on erasing in the sequence in accordance with one embodiment of the present invention.

FIG. 13 shows variations in threshold of the dummy cells by preprogramming.

Figure 15:
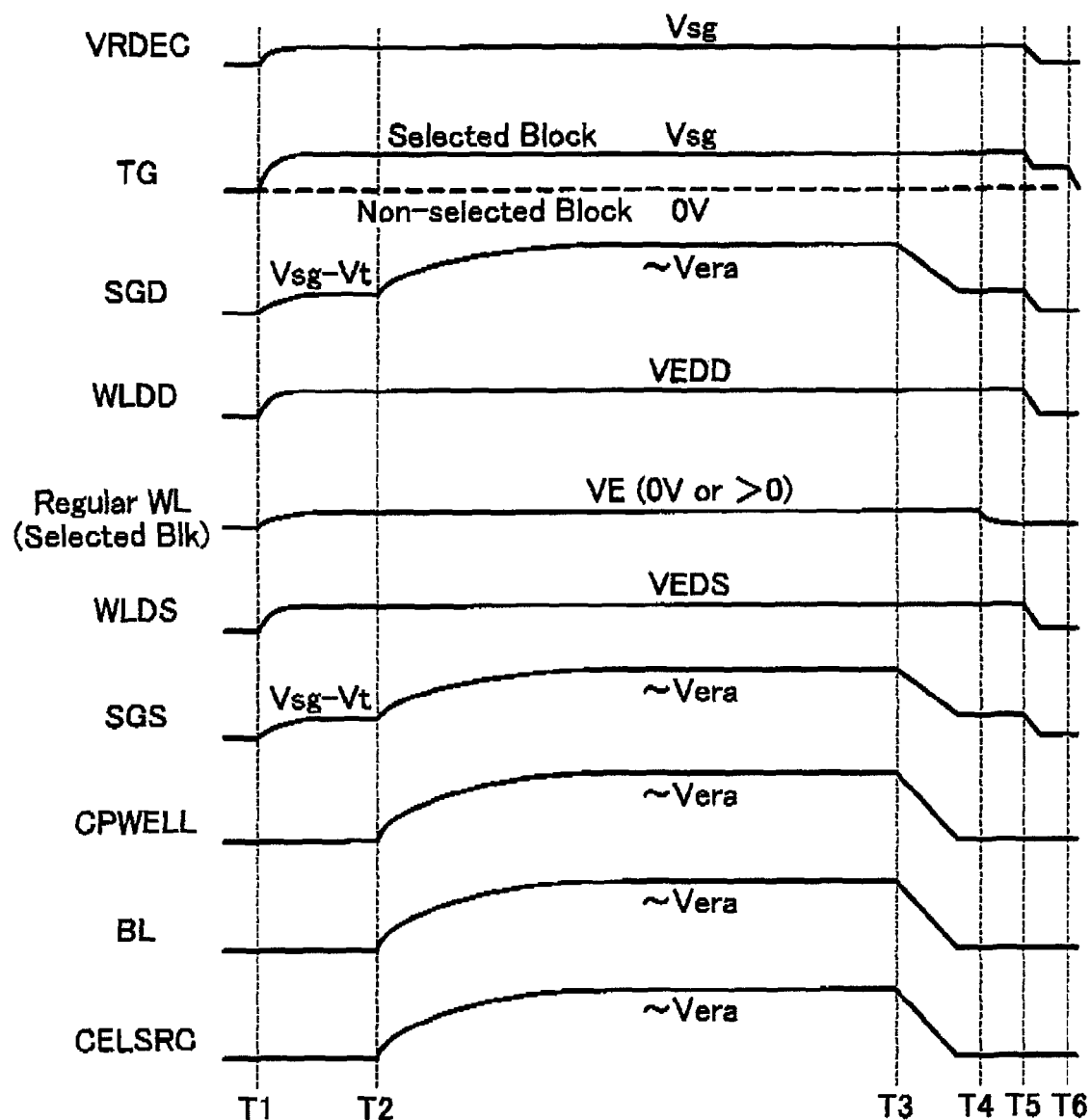
FIG. 15 is a diagram showing voltage waveforms on erasing in accordance with one embodiment of the present invention.

Next, an erase pulse is applied to the selected block (step S2) and then erase verifying is executed (step S3). FIG. 14 shows three methods of erase pulse applying and FIG. 15 shows erase pulse voltage waveforms.

The terminal of the p-type well including the memory cell array formed thereon, that is, the cell well terminal PWELL is given an erase voltage Vera. The regular word lines are given 0 V (the erase voltage-applying method 1) or VE ($\geqq$0 V) (the erase voltage-applying method 2). The dummy word lines WLDD and WLDS are given VEDD (>VE) and VEDS (>VE).

The selection gate lines are supplied with a voltage near the erase voltage Vera. Accordingly, the dummy word lines WLDD, WLDS are given slightly higher voltages than that on the regular word lines to relieve the potential difference therebetween.

For example, when the regular word lines are kept at 0 V, the regular cells are erased to a negative threshold of around −1 V or below as shown with a threshold distribution E0 in FIG. 16A. If VEDD and VEDS are 3 V, the dummy cells can not be erased to around 2 V or below as shown in FIG. 16B.

VEDD and VEDS must be such voltages that can turn on the transfer transistors 12 in the row decoder in the selected block on erasing. For instance, in the example of voltage applying shown in FIG. 15, VEDD, VEDS<Vsg−Vt is established (Vt is the threshold voltage of the transfer transistor).

The erase voltage-applying method 3 of FIG. 14 is a method of applying VESG (<Vpgm) to the selection gate lines. The selection gate transistor is not of the floating gate structure, different from the memory cell. Accordingly, it requires the potential difference between the gate and the cell well PWELL to be limited to around 4-5 V. The erase voltage-applying method 1 or 2 is such a conventional method that determines the voltage on the selection gate by coupling in the cell array, and is not a method that uses circuitry for accurate control. In contrast, the erase voltage-applying method 3 comprises applying such a voltage to the selection gate that the potential difference between that voltage and the erase voltage applied to the cell well PWELL reaches a certain potential difference (such as around 3 V). Thus, the potential difference between the selection gate line and an adjacent dummy word line can be accurately controlled smaller.

In erase verifying (step S3), as shown in FIG. 17, VEV is applied to the regular cells for verify reading while VEVDD (>VEV) and VEVDS (>VEV) are applied to the dummy cells for verify reading.

Figure 18:
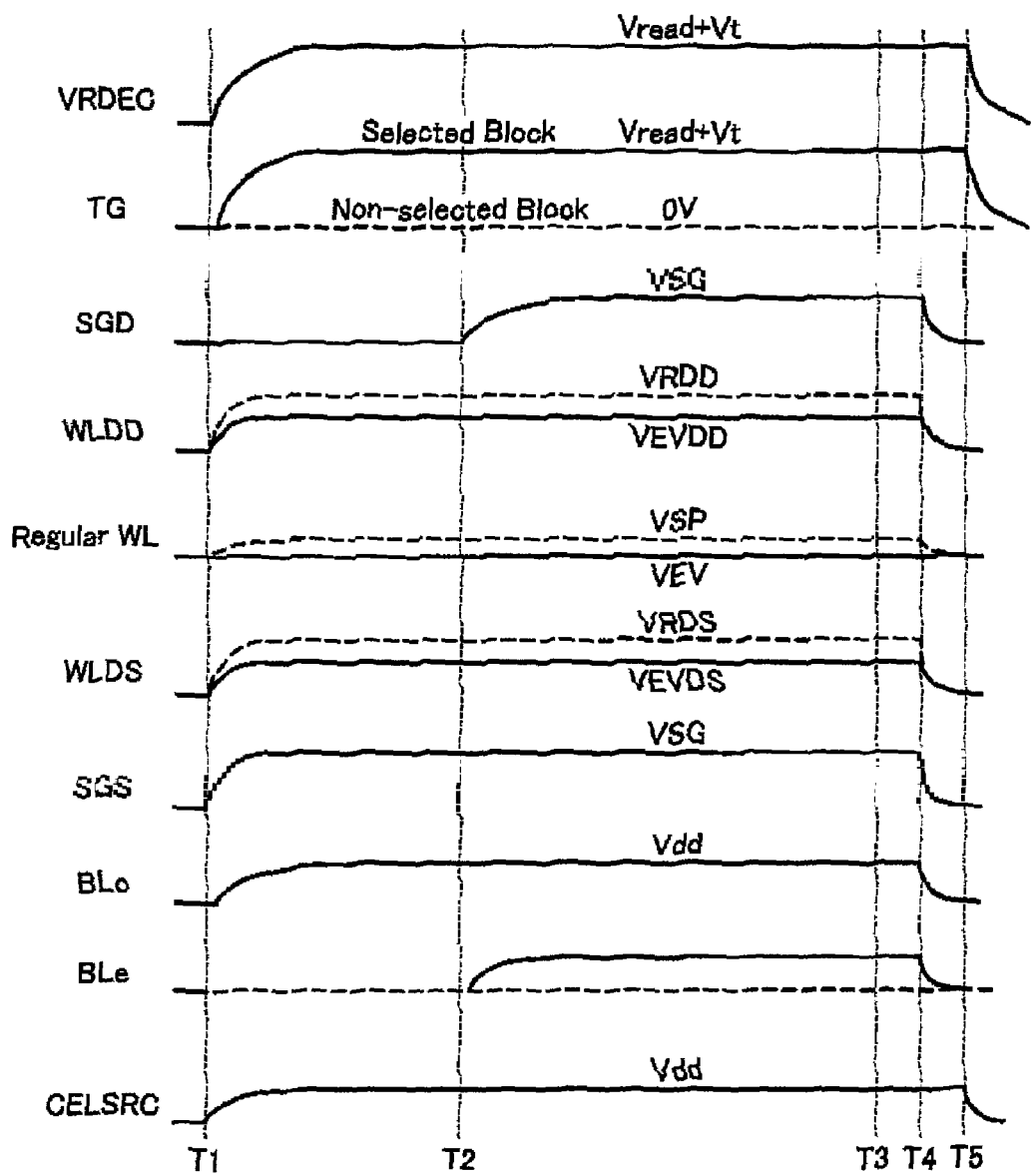
FIG. 18 is a diagram showing voltage waveforms on erase verifying in accordance with one embodiment of the present invention.

Operating waveforms on erase verifying are shown in FIG. 18. Different from normal reading, the cell source line CELSRC is given Vdd and all word lines are given a certain verify voltage in erase verifying to discharge the bit line to 0 V. Thereafter, the bit line is floated to sense a source follower voltage output onto the bit line.

Therefore, to reduce interference between bit lines, when an even bit line BLe is subjected to verify reading, an adjacent odd bit line BLo is kept at a fixed voltage (such as Vdd as shown) for execution of reading in a shielded state. In contrast, when an odd bit line BLo is verified, an even bit line BLe is turned in a shielded bit line.

All regular word lines in the selected block are given VEV=0 V and the dummy word lines WLDD, WLDS are given VEVDD, VEVDS. In this case, if the threshold of the regular cell is Vt=−1 V and the threshold of the dummy cell is equal to VEVDD−2 [V] (VEVDS−2 [V]), the voltage on the bit line is determined by the threshold of the regular cell to about 1 V.

In this embodiment, erase verifying is executed to the regular cells and to the dummy cells at the same time. Therefore, a smaller one of margins of threshold voltages to the voltages applied to the respective word lines determines the voltage output onto the bit line. The bit line, voltage output in accordance with the threshold of the memory cell in this way is read out at the sense amp at a certain timing (T3 in FIG. 18).

If the bit line voltage is equal to or higher than a certain voltage, it results in erase verify pass. For example, if the bit line voltage equal to or higher than 1 V is used as a pass/fail decision level, the decision level VEVDD−α/VEVDS−α for the dummy cell shown in FIG. 16B has a guide of VEVDD−1 [V] (VEVDS−1 [V]). Although not shown in FIG. 16B, −1 V or lower serves as a guide of the decision level for the regular cell.

FIG. 19 shows a voltage applying method in soft program pulse applying (step S5). In execution of soft programming only to the regular cells, Vspgm is applied to the regular word lines, and VSPDD (<Vspgm) and VSPDS (<Vspgm) are applied to the dummy word lines, as in the voltage applying method (1) of FIG. 19.

In soft programming, it is important to make the threshold distribution of the regular cells as narrow as possible. Accordingly, it has a written state to bring the channel into 0 V and a non-written state to boost the channel. Boosting the channel may cause GIDL at an edge of the selection gate possibly.

An ill effect considered first accordingly is to shift the threshold of the dummy cell. If suppression of occurrences of GIDL is considered preferentially, including the possibility of any other ill effects, the dummy word line voltages VSPDD, VSPDS lower than Vspgm may be used to suppress the voltage applied to the drain edge of the selection gate.

In practice, however, the threshold distribution of the dummy cells is desired as narrow as possible. Accordingly, it is desirable to also execute soft programming to the dummy cells within a range that permits the influence from GIDL occurrences.

As shown in the voltage-applying method (2) of FIG. 19, certain voltages of Vpgm or higher may be applied as the voltages VspgmDD, VspgmDS on the dummy word lines WLDD, WLDS. In this case, faster write/erase characteristic cells distributed over the lower tail can be written with hardly shifting the main distribution of the dummy cells.

Soft programming to the dummy word lines hardly shifts the threshold if GIDL on non-writing in soft programming is suppressed as in the voltage applying method (1) of FIG. 19. In the method (2), however, including the influence from GIDL, the threshold of the dummy cell may be considered to shift.

Therefore, soft-program verifying is executed with applying such a voltage to the dummy cell that can turn on it sufficiently in such a manner that the shift in the threshold of the dummy cell does not interfere with verifying of the regular cell. Two soft-program verifying steps S6, S8 are executed in the source follower scheme, like the above-described erase verifying.

Figures 20, 21:
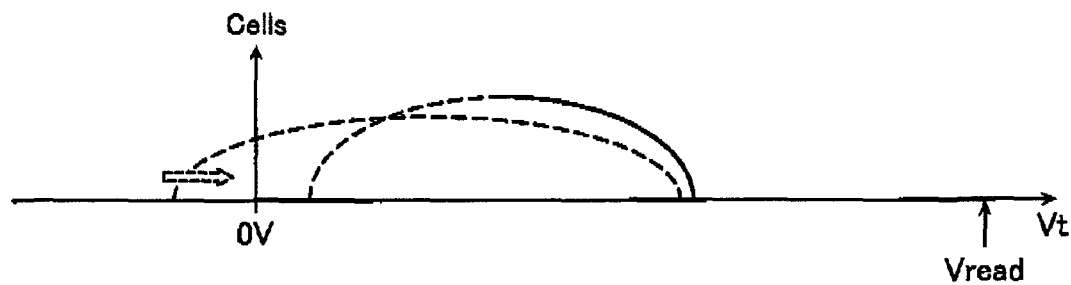
FIG. 20 is a diagram showing a voltage applying method on soft program verifying in the sequence in accordance with one embodiment of the present invention.
FIG. 21 is a diagram showing variations in threshold in dummy cells by soft programming in accordance with one embodiment of the present invention.

FIG. 20 shows voltages at two soft-program verifying steps S6, S8. FIG. 18 shows voltage waveforms not only on erase verifying but also on soft-program verifying together.

In the first soft-program verifying step S6, all regular word lines WL0-31 are given VEV, like on erase verifying, and the dummy word lines WLDD, WLDS are given VRDD (>VEV), VRDS (>VEV). In the second verifying step S8, all regular word lines are given VSP (>VEV), and the dummy word lines WLDD, WLDS are given VRDD (>VSP), VRDS (>VSP), as in the first verifying step s6.

FIG. 21 shows a threshold distribution of the dummy cells resulted from soft programming and the associated verifying.

FIG. 22 shows operating voltages in the above embodiment in summary including writing and reading (verify reading). In reading (verify reading), a selected word line (WL0) is given a read voltage (verify voltage) VCGRV determined in accordance with read data, and non-selected word lines are given a read pass voltage Vread. In addition, the dummy word lines WLDD, WLDS are given the voltages VRDD, VRDS, which can turn on the dummy cells even at the upper limit of the threshold voltage of the dummy cells guaranteed by erasing.

[Second Erase Sequence]

Figure 23:
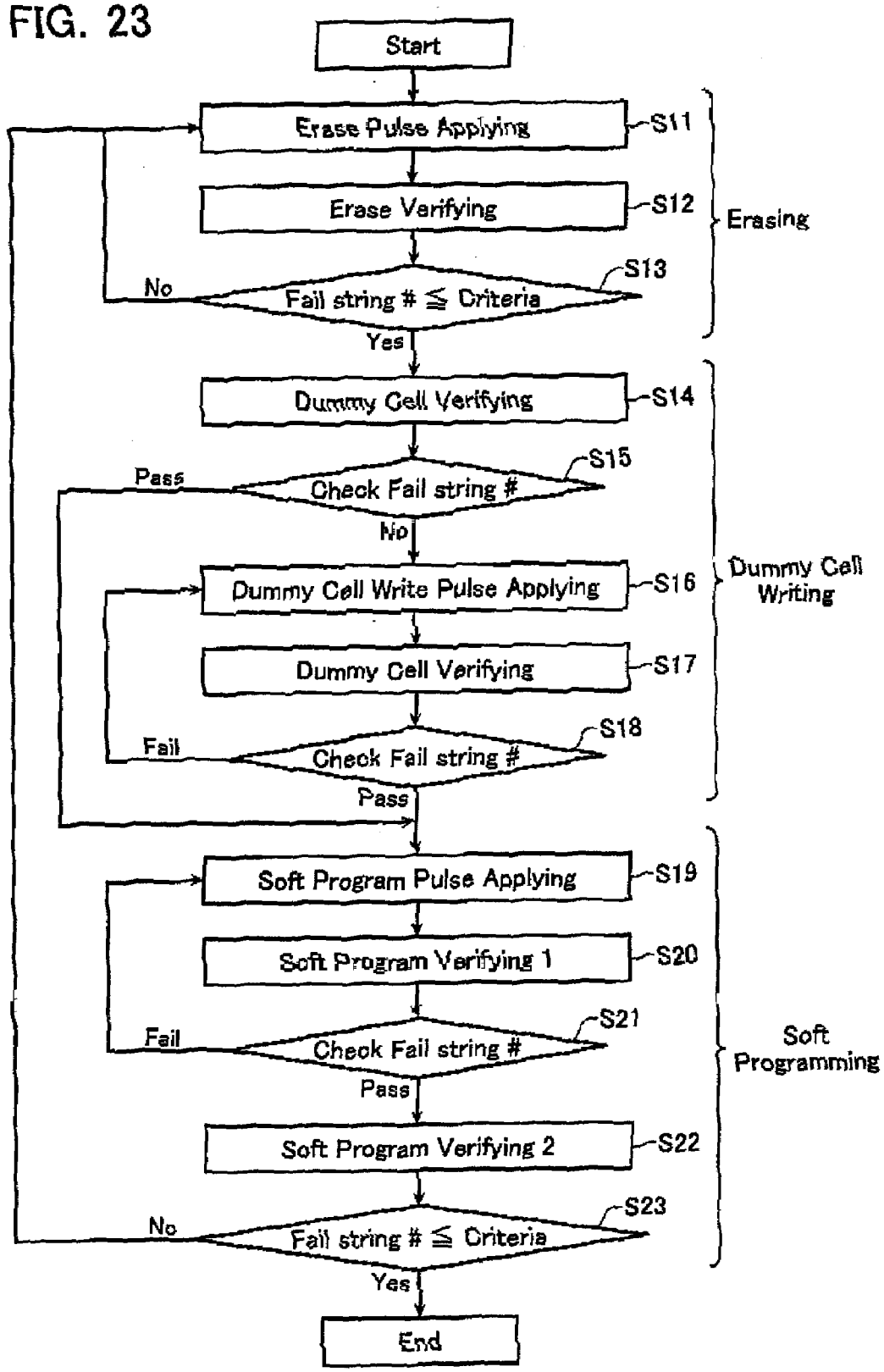
FIG. 23 is a diagram showing a flow of a second erase sequence in accordance with one embodiment of the present invention.

FIG. 23 shows a second erase sequence, which is same as the previous first erase sequence in that the threshold voltage of the dummy cells is set in a positive state, but which uses a different method to control the threshold of the dummy cells.

First, at the start of the erase sequence, an erase pulse is applied to the selected block (step S11). At the same time, the regular word lines are supplied with VE (such as 0 V), and the dummy word lines are supplied with VEDD, VEDS (which may be VEDD=VEDS), like the first erase sequence. Under such the erase condition, the threshold of the dummy cell can not be erased as low as the regular cell.

Subsequently, erase verifying (step S12) and decision (step S13) are executed as in the previous erase sequence such that the regular cell is verified with VEV-α (FIG. 16A) and the dummy cell with VEVDD-α/VEVDS-α (FIG. 16B).

The erase pulse applying is repeated until both cells reach respective verify levels or below to satisfy a certain decision condition. A decision on completion of erase (step S13) is made by checking data in a page buffer after erase verifying to determine whether the number of NAND strings corresponding to erase Fail is equal to or lower than a certain number.

Next, dummy cell write control is executed. First, write verifying is executed to the dummy cells (step S14). The verifying voltage applied to the dummy cells is set at 0 V or around a verifying voltage in the distribution of the data state A to detect a dummy cell at a much lower state.

The thresholds of the dummy cells after the above-described erasing distribute over a wide range below VEVDD/VEVDS. As a result of the verifying, the write-targeted dummy cells may include many dummy cells classified into fast erasable cells that can be erased to 0 V or a lower limit value of the data A or below with a high possibility. If it is determined in the verify decision step S15 that any dummy cell erased to such the lower level is not present (Pass), writing in the dummy cells is not executed.

Figure 24:
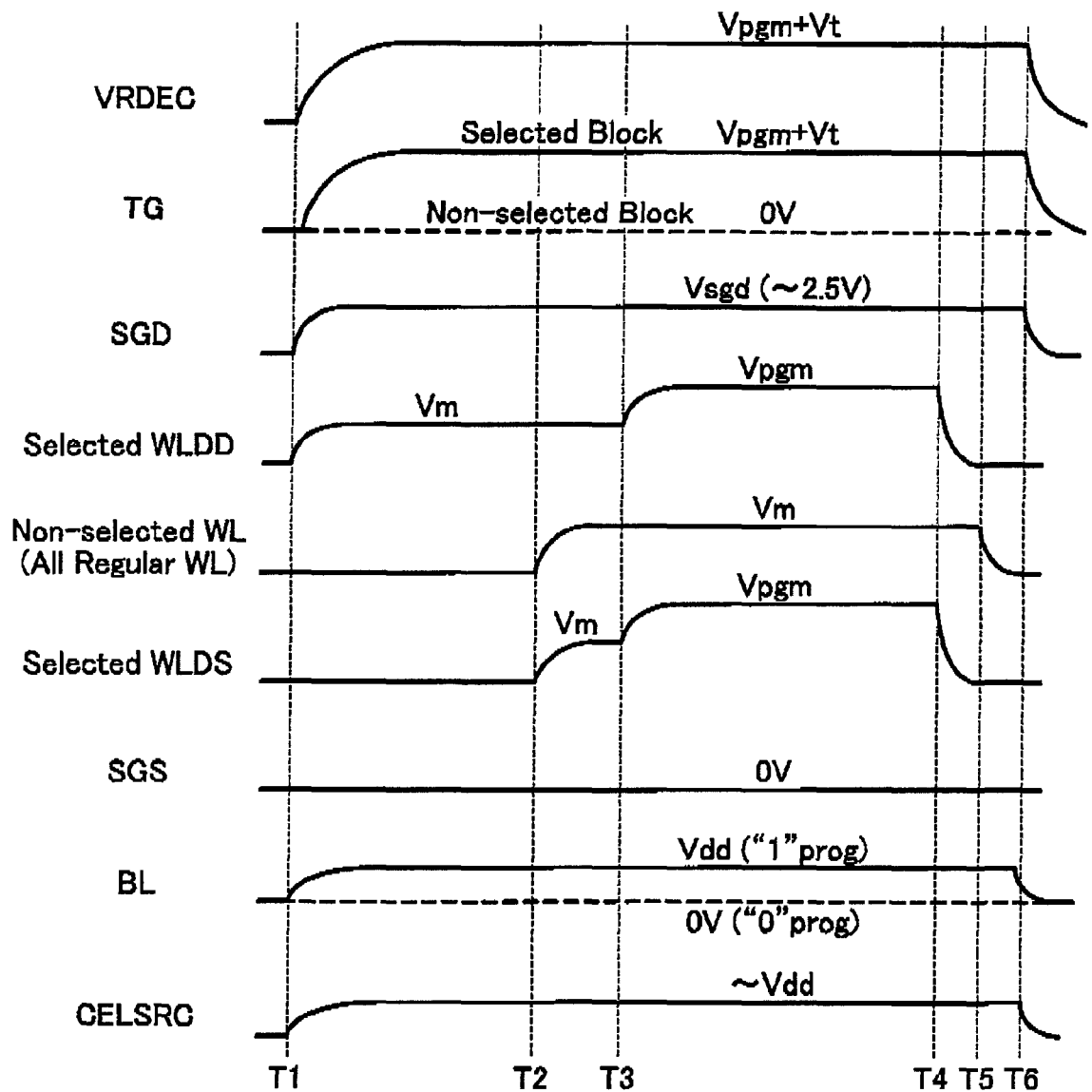
FIG. 24 is a diagram showing voltage waveforms on dummy cell writing in the second erase sequence in accordance with one embodiment of the present invention.
Figure 25:
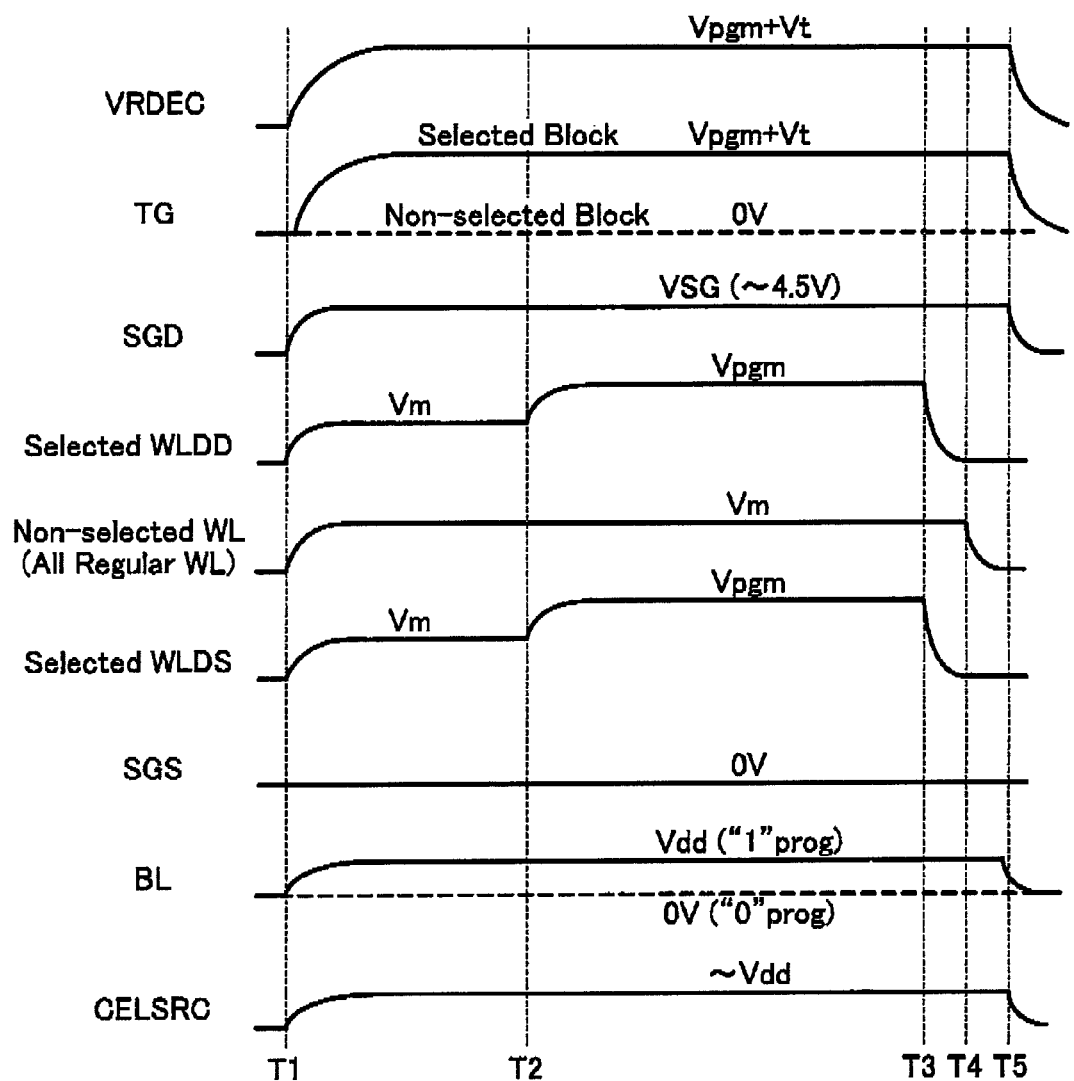
FIG. 25 is a diagram showing another voltage waveforms on dummy cell writing in the second erase sequence in accordance with one embodiment of the present invention.

If the decision at step S15 results in Fail, write pulse applying is executed to the dummy cells (step S16). Namely, as shown in FIG. 24 or FIG. 25, the dummy word line WLDS/WLDD is supplied with the write voltage Vpgm, and all regular word lines (non-selected word lines) are supplied with the write pass voltage Vm (<Vpgm).

As writing requires selectivity between write and non-write, the source-line side selection gate line SGS is given 0 V. In this case, the dummy word line WLDS and the selection gate line SGS have a potential difference of Vpgm therebetween. In the dummy cell writing, the write-targeted verify voltage ranges from 0 V to around the lower limit value of the data state A as described above. In addition, the write-targeted memory cells may be considered faster write/erase characteristic cells. Therefore, the voltage required as the write voltage Vpgm is not a higher voltage sufficient to write the data state C but a lower voltage than the write voltage used in regular cell writing.

After dummy cell writing, verify reading is executed (step S17) and then a verify-decision is made (step S18). Writing in the dummy cell terminates if the write-targeted dummy cells exceed the verify level. The decision condition may require that all write-targeted cells can be written. Alternatively, as it is not normal storage data, writing may terminate if the number of Fail cells after verify is equal to or smaller than a certain tolerable number.

After the dummy cells are written to levels higher than a certain verify level, the dummy cells are brought into a non-write state in next write pulse applying. Namely, the voltage on the bit line connected to the NAND string reaches Vdd.

In normal page writing, the voltage applied to the bit-line side selection gate line SGD is made slightly lower than Vdd (for example, around 2-2.5 V when Vdd=2.5 V) such that the selection gate transistor SG1 can be cut of f on channel boosting in the NAND string. Channel boosting in the NAND string, however, may cause GIDL at the drain end of the selection gate transistor.

In write pulse applying of FIG. 24, the selection gate line SGD is kept at Vsgd=~2.5 V to write in the dummy cell, like in normal page writing. The influence from GIDL results in a positively shifted threshold when resultant electrons are injected into the floating gate. In the original design, the threshold of the dummy cell is written up to a positive state. Accordingly, unless the threshold remarkably elevates or GIDL exerts ill effects in other forms, the dummy cell may be controlled for writing under this write pulse applying condition.

The boosted channel potential can be adjusted with the pass voltage Vm applied to the regular word line. Therefore, the influence from GIDL can be optimized to some extent with the adjustment of the pass voltage Vm.

On the other hand, write pulse applying as in FIG. 25 may be available. This voltage applying method comprises giving a higher voltage VSG (for example, 4.5 V) to the bit-line side selection gate line SGD to cause a non-write state without channel boosting. In the non-write state, the selection gate transistor SG1 is prevented from being cut off. Thus, the voltage Vdd on the bit line is supplied to the channels in the NAND string to substantially inhibit writing.

After completion of dummy cell write, soft-program control for the regular cell is executed next. This soft-program control is same as in the previous first erase sequence and includes soft programming (step S19), two stages of soft-program verifying (steps S20, S22), and decisions on the verify-read results therefrom (steps S21, S23).

FIG. 26 shows operating voltages including writing and reading (verify reading) when the second erase sequence is applied. The major part is similar to that in FIG. 22.

As described above with two examples of the erase sequence, the potential difference between the word line associated with the dummy cell and the line of the selection gate is controlled to become smaller in erasing. This is effective to relieve the electric field between lines while setting the threshold voltage of the dummy cell within a range lower than a certain positive voltage. As a result, the voltage applied to the dummy cell in writing can be elevated as high as possible. Thus, while reducing the potential difference between the word line associated with the regular cell and the word line associated with the dummy cell, a measure can be taken directed toward the prevention of erroneous write due to GIDL. Such the control on relief of the electric field across lines makes it possible to realize a NAND-type flash memory ready for fine patterning.

What is claimed is:

1. A semiconductor memory device having a memory cell array configured by arranging a plurality of NAND cell units, said NAND cell unit comprises:
    a plurality of electrically erasable programmable nonvolatile memory cells connected serially;
    a first and a second selection transistor provided to connect both ends of said memory cells to a bit line and a source line, respectively; and
    dummy cells inserted in said NAND cell unit adjacent to said first and second selection transistors, respectively, wherein said dummy cells in said NAND cell unit are erased simultaneously with said memory cells under a weaker erase potential condition than that for said memory cells and set in a higher threshold distribution than an erased state of said memory cells, and
    wherein prior to erasing all NAND cell units in said erase unit, preprogramming is executed to selectively elevate the threshold of said dummy cells in said erase unit.

2. The semiconductor memory device according to claim 1, wherein
    said semiconductor memory device has an erase mode in which an erase voltage is applied to a well region including said memory cell array formed therein, a first voltage of just or near 0 V is applied to control gates of said memory cells in said erase unit, and a second voltage higher than said first voltage is applied to control gates of said dummy cells.

3. The semiconductor memory device according to claim 1, wherein after collectively erasing all NAND cell units in said erase unit, soft-programming is executed for dissolving an over-erased cell in said erase unit.

4. The semiconductor memory device according to claim 1, wherein after erasing all NAND cell units in said erase unit, writing is executed to said dummy cells in said erase unit for setting a higher threshold distribution than said erased state of said memory cells.

5. The semiconductor memory device according to claim 4, wherein after said writing, soft programming is executed for dissolving an over-erased cell in said erase unit.

6. A method of erasing data in a semiconductor memory device, said semiconductor memory device comprising a memory cell array of NAND cell units each including a plurality of electrically erasable programmable nonvolatile memory cells connected serially, and a first and a second selection transistor provided to connect both ends of said memory cells to a bit line and a source line, respectively, and dummy cells inserted in said NAND cell unit adjacent to said first and second selection transistors, respectively, said method comprising:
    prior to collectively erasing an erase unit in said memory cell array, executing preprogramming to elevate the threshold of said dummy cells in said erase unit;
    collectively erasing all memory cells in said erase unit including said dummy cells under a weaker erase potential condition for said dummy cells than that for said memory cells; and
    executing soft-programming for dissolving an over-erased cell in said erase unit.

7. The method according to claim 6, wherein said weaker erase voltage condition requires that said voltage applied to control gates of said dummy cells is higher than said voltage applied to control gates of said memory cells.

8. The method according to claim 6, wherein said collective erasing is executed by applying to said control gates of said first and second selection gate transistors a voltage that causes a certain potential difference between said gates and said well region including said memory cell array formed therein.

9. The method according to claim 6, wherein said soft-programming is executed by applying to said gate of said first selection gate transistor a voltage higher than a voltage applied to said gate of said second selection gate transistor, and applying to said control gates of said dummy cells a voltage lower than a voltage applied to said control gates of said memory cells.

10. The method according to claim 6, wherein said soft-programming is executed by applying to gate of said first selection gate transistor a voltage higher than a voltage applied to said gate of said second selection gate transistor, and applying to said control gates of said dummy cells a voltage equal to or higher than the voltage applied to said control gates of said memory cells.

11. A method of erasing data in a semiconductor memory device, said semiconductor memory device comprising a memory cell array of NAND cell units each including a plurality of electrically erasable programmable nonvolatile memory cells connected serially, and a first and a second selection transistor provided to connect both ends of said memory cells to a bit line and a source line, respectively, and dummy cells inserted in said NAND cell unit adjacent to said first and second selection transistors, respectively, said method comprising:
   collectively erasing all memory cells in an erase unit in said memory cell array including said dummy cells under a weaker erase potential condition for said dummy cells than that for said memory cells;
   executing writing to elevate the threshold of said dummy cells in said erase unit; and
   executing soft-programming for dissolving an over-erased cell in said erase unit.

12. The method according to claim 11, wherein said weaker erase voltage condition requires that said voltage applied to control gates of said dummy cells is higher than said voltage applied to control gates of said memory cells.

13. The method according to claim 11, wherein said writing is executed by applying to a gate of said first selection gate transistor a first voltage, applying to a gate of said second selection gate transistor a second voltage lower than said first voltage, and applying to control gates of said dummy cells a voltage higher than a voltage applied to control gates of said memory cells.

14. The method according to claim 13, wherein said first voltage is a voltage equal to or lower than a supply voltage, and said second voltage is 0 V.

15. The method according to claim 13, wherein said first voltage is a voltage higher than a supply voltage, and said second voltage is 0 V.

16. A semiconductor memory device having a memory cell array configured by arranging a plurality of NAND cell units, said NAND cell unit comprises:
   a plurality of electrically erasable programmable nonvolatile memory cells connected serially;
   a first and a second selection transistor provided to connect both ends of said memory cells to a bit line and a source line, respectively; and
   a first dummy cell and a second dummy cell inserted in said NAND cell unit adjacent to said first and second selection transistors, respectively,
   wherein a first voltage is applied to said first dummy cell prior to applying a second voltage to said second dummy cell in a programming for said memory cell.

* * * * *